US009418822B2

(12) United States Patent
Kaneko et al.

(10) Patent No.: US 9,418,822 B2
(45) Date of Patent: Aug. 16, 2016

(54) PLASMA PROCESSING APPARATUS, PLASMA PROCESSING METHOD AND HIGH FREQUENCY GENERATOR

(71) Applicant: Tokyo Electron Limited, Tokyo (JP)

(72) Inventors: Kazushi Kaneko, Sendai (JP); Naoki Matsumoto, Miyagi (JP); Koji Koyama, Miyagi (JP); Kazunori Funazaki, Miyagi (JP); Hideo Kato, Miyagi (JP); Kiyotaka Ishibashi, Sendai (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 278 days.

(21) Appl. No.: 14/177,421

(22) Filed: Feb. 11, 2014

(65) Prior Publication Data

US 2014/0225504 A1    Aug. 14, 2014

Related U.S. Application Data

(60) Provisional application No. 61/769,907, filed on Feb. 27, 2013.

(30) Foreign Application Priority Data

Feb. 12, 2013   (JP) ................................ 2013-024145

(51) Int. Cl.
*H01J 37/32*   (2006.01)
*H05H 1/46*    (2006.01)
*H03L 5/02*    (2006.01)

(52) U.S. Cl.
CPC ..... *H01J 37/32935* (2013.01); *H01J 37/32192* (2013.01); *H03L 5/02* (2013.01); *H05H 1/46* (2013.01); *H05H 2001/463* (2013.01); *H05H 2001/4682* (2013.01)

(58) Field of Classification Search
USPC ................................................... 315/111.21
See application file for complete search history.

(56) References Cited

U.S. PATENT DOCUMENTS

| 5,384,800 A | * | 1/1995 | Hochgraber | H01S 3/0975 372/25 |
| 5,520,771 A | * | 5/1996 | Kanai | H01J 37/32192 156/345.41 |
| 5,580,420 A | * | 12/1996 | Watanabe | H01J 37/32192 156/345.41 |

(Continued)

FOREIGN PATENT DOCUMENTS

| JP | 4115618 B2 | 7/2008 |
| WO | 2004/068917 | 8/2004 |

*Primary Examiner* — Douglas W Owens
*Assistant Examiner* — Srinivas Sathiraju
(74) *Attorney, Agent, or Firm* — Pearne & Gordon LLP

(57) ABSTRACT

A plasma processing apparatus includes a plasma generating device configured to generate a plasma within a processing vessel by using a high frequency wave generated by a microwave generator 41 including a magnetron 42 configured to generate the high frequency wave; detectors 54a and 54b configured to measure a power of a traveling wave that propagates to a load side and a power of a reflected wave reflected from the load side, respectively; and a voltage control circuit 53a configured to control a voltage supplied to the magnetron 42 by a power supply 43. Further, the voltage control circuit 53a includes a load control device configured to supply, to the magnetron 42, a voltage corresponding to a power calculated by adding a power calculated based on the power of the reflected wave measured by the detector 54b to the power of the traveling wave measured by the detector 54a.

12 Claims, 17 Drawing Sheets

(56) References Cited

U.S. PATENT DOCUMENTS

| | | | | |
|---|---|---|---|---|
| 5,804,033 A * | 9/1998 | Kanai | ............... | H01J 37/32229 118/723 MW |
| 6,016,766 A * | 1/2000 | Pirkle | ................... | C23C 16/511 118/723 MA |
| 6,031,198 A * | 2/2000 | Moriyama | ........ | H01J 37/32165 219/121.43 |
| 2006/0071607 A1* | 4/2006 | Chen | ................... | H01J 37/3222 315/111.01 |
| 2006/0124244 A1 | 6/2006 | Ishii et al. | | |
| 2008/0154495 A1* | 6/2008 | Breed | ................... | G01C 21/20 701/472 |
| 2008/0282979 A1* | 11/2008 | Chen | ................ | H01J 37/32192 118/722 |
| 2009/0026170 A1* | 1/2009 | Tanaka | .............. | H01J 37/32706 216/60 |
| 2009/0159214 A1* | 6/2009 | Kasai | ................ | H01J 37/32192 156/345.41 |
| 2010/0258529 A1* | 10/2010 | Mori | ................. | H01J 37/32091 216/67 |
| 2011/0061814 A1* | 3/2011 | Ikeda | ................ | H01J 37/32192 156/345.41 |
| 2011/0150719 A1* | 6/2011 | Ikeda | ................ | H01J 37/32192 422/186 |
| 2011/0174778 A1* | 7/2011 | Sawada | ............. | H01J 37/32091 216/68 |
| 2012/0247675 A1* | 10/2012 | Ikeda | ................ | C23C 16/45565 156/345.34 |
| 2012/0255491 A1* | 10/2012 | Hadidi | ............. | H01J 37/32935 118/712 |
| 2013/0192760 A1* | 8/2013 | Ikeda | ................ | H01J 37/32027 156/345.41 |

\* cited by examiner

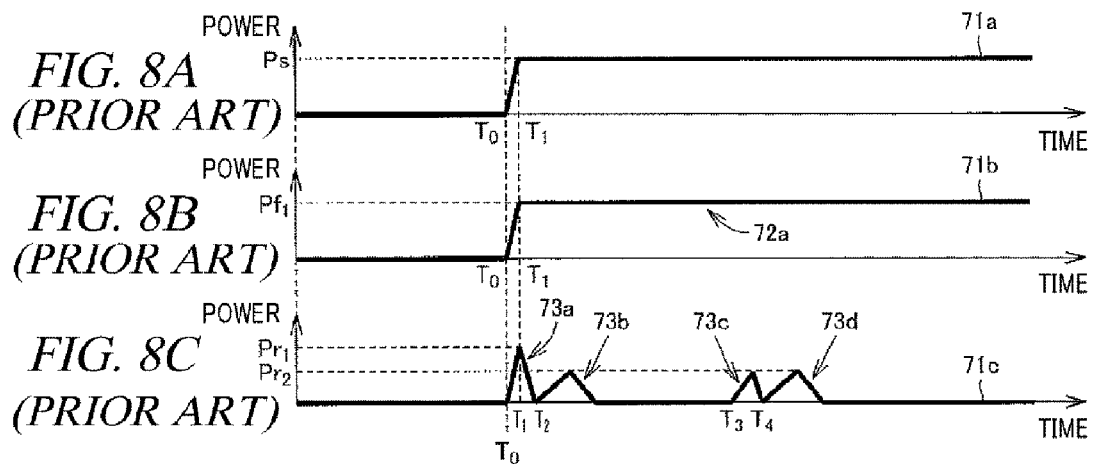
FIG. 8A (PRIOR ART)
FIG. 8B (PRIOR ART)
FIG. 8C (PRIOR ART)
FIG. 9
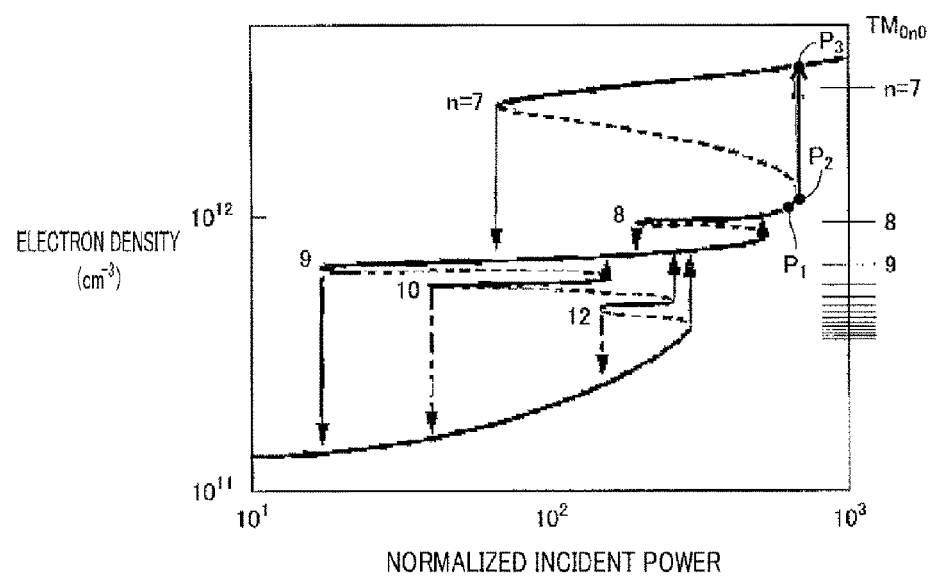

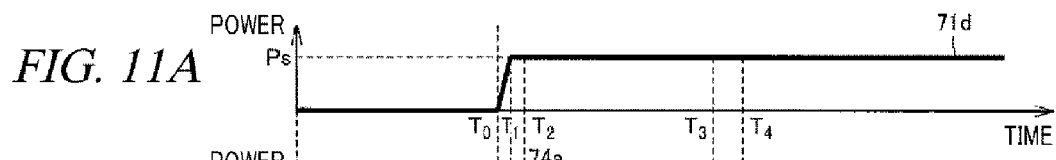
FIG. 11A
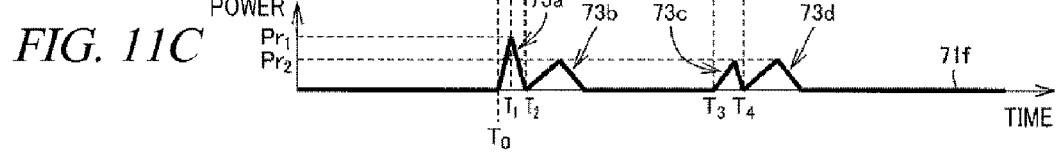
FIG. 11B
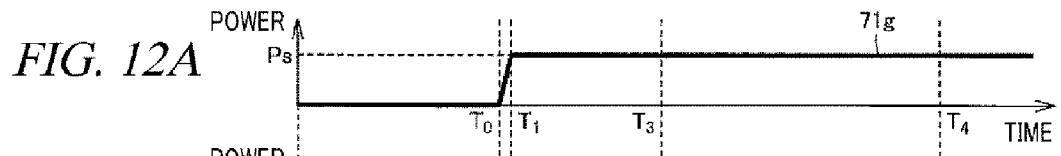
FIG. 11C
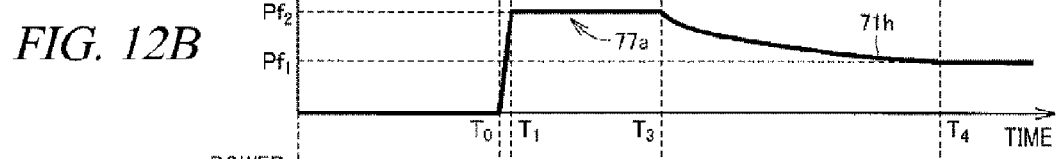
FIG. 12A
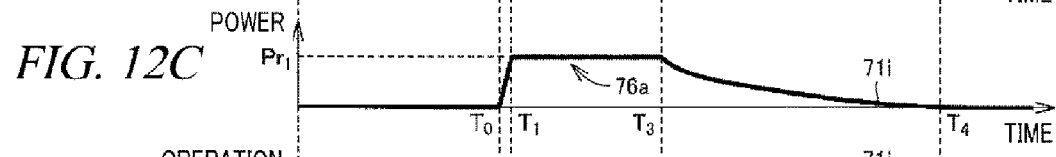
FIG. 12B
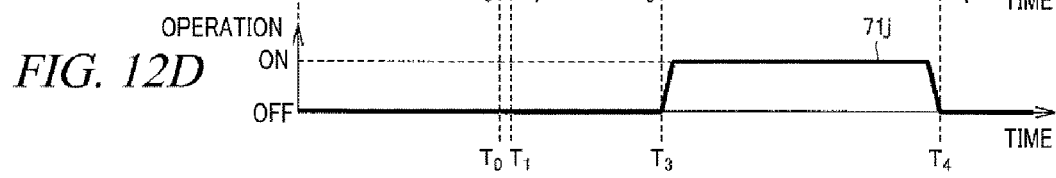
FIG. 12C
FIG. 12D

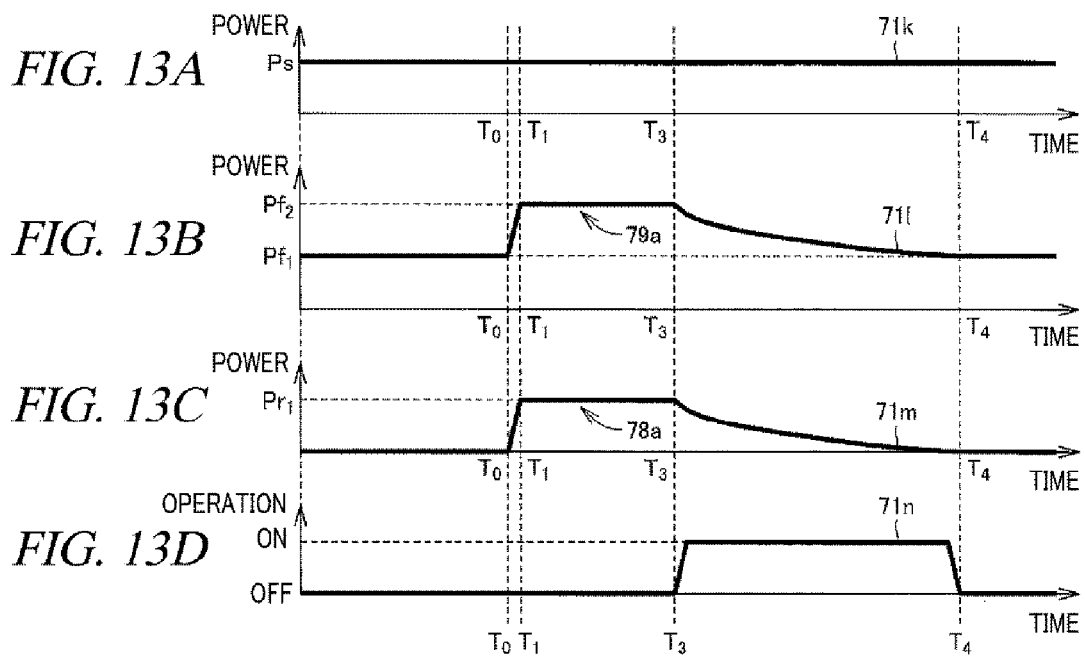
FIG. 13A
FIG. 13B
FIG. 13C
FIG. 13D
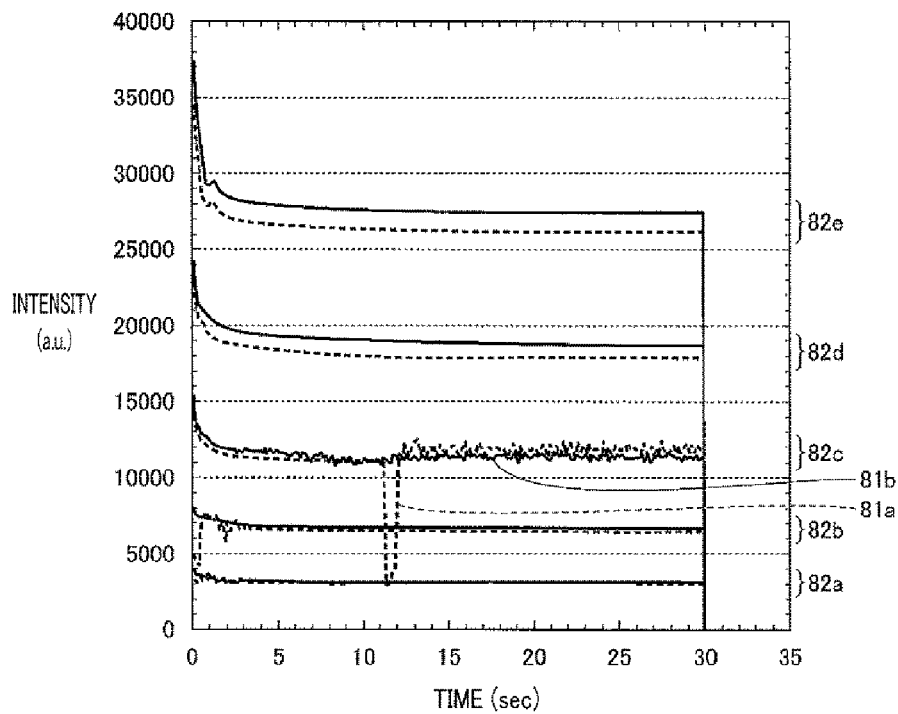
FIG. 14

PLASMA PROCESSING APPARATUS, PLASMA PROCESSING METHOD AND HIGH FREQUENCY GENERATOR

CROSS-REFERENCE TO RELATED APPLICATION

This application claims the benefit of Japanese Patent Application No. 2013-024145 filed on Feb. 12, 2013, and U.S. Provisional Application Ser. No. 61/769,907 filed on Feb. 27, 2013, the disclosures of which are incorporated herein by reference.

TECHNICAL FIELD

The embodiments described herein pertain generally to a plasma processing apparatus, a plasma processing method, and a high frequency generator; and, more particularly, to a high frequency generator configured to generate a microwave, a plasma processing apparatus configured to generate plasma by using the microwave, and a plasma processing method.

BACKGROUND

A semiconductor device such as a LSI (Large Scale Integrated circuit) or a MOS (Metal Oxide Semiconductor) transistor, a liquid crystal display (LCD), an organic EL (Electro Luminescence) device, and the like are manufactured by performing a process such as etching, CVD (Chemical Vapor Deposition) or sputtering on a processing target substrate. For the etching, CVD and sputtering processes, methods using plasma as an energy supply source, i.e., plasma etching, plasma CVD and plasma sputtering are employed.

Here, a technique related to a plasma processing apparatus configured to perform a process by using plasma is described in International Patent Publication No. WO2004/068917 (Patent Document 1). According to Patent Document 1, a magnetron is used as a high frequency oscillating source for generating a microwave. Since the magnetron is of a relatively low price and is capable of outputting a high power, the magnetron is effectively used as the oscillating source for generating a microwave.

In the plasma processing apparatus described in Patent Document 1, an automatic matching device is provided. The automatic matching device includes a load matcher composed of a multiple number of stubs protruded from an inner wall surface of a cylindrical waveguide in a radial direction thereof. Each stub is a cylindrical body made of a metal or a dielectric material. A reactance of the stub may vary depending on its protruding length, i.e., a length protruded from the inner wall surface of the cylindrical waveguide in a radial direction thereof, and a reactance within the cylindrical waveguide may also vary depending on the reactance of the stub. The protruding length of the stub can be easily varied by a driving device of the load matcher.

A technique of generating a microwave using a magnetron is also described in Japanese Patent Publication No. 4115618 (Patent Document 2). Patent Document 2 describes a magnetron output control method. In this method, a standing wave of a microwave is split into a traveling wave that propagates from the magnetron toward a plasma load and a reflected wave reflected from the plasma load. By detecting the traveling wave and the reflected wave, a signal corresponding to a power of the traveling wave and a signal corresponding to a power of the reflected wave are detected. If the signal corresponding to the power of the reflected wave is equal to or higher than a preset reference value, an output control of the magnetron is switched from a control of regulating the power of the traveling wave into a constant value to a control of regulating an anode current to a constant value. Meanwhile, if the signal corresponding to the power of the reflected wave is less than the preset reference value, the output control of the magnetron is switched from the control of regulating the anode current to the constant value into the control of regulating the power of the traveling wave to the constant value.

Patent Document 1: International Patent Publication No. WO2004/068917

Patent Document 2: Japanese Patent Publication No. 4115618

According to Patent Document 1, a controller provided in the plasma processing apparatus calculates a load side impedance from an output signal of a detector and calculates the protruding length of the stubs that allows impedance matching between a power supply side and a load side. Then, the controller adjusts the protruding length of the stubs by operating the driving device of the load matching unit based on the calculation result, so that the impedance matching between the power supply side and the load side can be performed. Further, a 4E tuner as a matching device is provided between the magnetron and the load side, and the impedance matching is performed by adjusting positions of four movable short-circuit plates provided in the 4E tuner. To elaborate, the movable short-circuit plates are arranged at certain positions in the cylindrical waveguide. A position of each movable short-circuit plate, specifically, a position in a radial direction thereof is adjusted by rotating a ball screw by a motor, so that impedance matching is performed. Further, by detecting, e.g., whether an emission intensity of a wavelength of a certain element, which is included in plasma generated in a processing vessel, is stable or not, it can be investigated whether the reactance matching is performed or not, or whether the generated plasma is stable or not.

As for the control of adjusting the protruding length of the stubs or the positions of the movable short-circuit plates, it may take a long time before the stubs or the movable short-circuit plates are actually moved and arranged at the appropriately calculated positions after a control signal is outputted. That is, the control of adjusting the protruding length of the stubs or the positions of the movable short-circuit plate may lack rapid responsiveness. Under this circumstance, the generated plasma may be unstable in the plasma processing apparatus configured to generate a microwave by using the magnetron and to generate plasma by using the microwave.

To elaborate, as the microwave generated by the magnetron propagates in the waveguide, a traveling wave is generated. This traveling wave is monitored by detecting a power of the traveling wave that propagates within the waveguide. Here, a reflected wave reflected from a load side may be generated depending on a kind of a gas supplied into the processing vessel or a variation in a pressure within the processing vessel. This reflected wave is also monitored by detecting a power of the reflected wave, and there may arise occasions when the power of the reflected wave increases rapidly. In such occasions, it may be difficult to appropriately respond to the rapid increase of the power of the reflected wave just by adjusting the protruding length of the stubs or the positions of the movable short-circuit plates. That is, in performing the matching of the power of the reflected wave, it may take a long time to start the alignment of the positions of the movable short-circuit plate. As a result, before the position alignment of the movable short-circuit plates is started, a phenomenon, called spike, that plasma emission is darkened momentarily or a phenomenon, called hunting, that plasma emission is darkened or brightened repeatedly may occur repeatedly. If such phenomenon as hunting occurs, it may take a long time until stable plasma is generated, which is undesirable. Further, in the control of the plasma processing apparatus, if the detected power of the reflected wave exceeds a set threshold value or if an emission intensity at a wavelength of a certain element being measured is below a reference value, it may be determined that the plasma processing apparatus is performing an inappropriate plasma process, and the plasma process may be stopped.

According to Patent Document 2, the output control of the magnetron may be switched between the control of regulating the power of the traveling wave to a constant value and the control of regulating the anode current to a constant value by using the reference value for the power of the reflected wave as a threshold value. According to this control manner, however, a power supplied from the magnetron to the load side may be changed. As a result, when the plasma process is performed by the plasma generated in the plasma processing apparatus, the non-uniform plasma process may be performed.

SUMMARY

In one example embodiment, a plasma processing apparatus that performs a process on a processing target object by using plasma includes a processing vessel configured to perform therein the process by the plasma; and a plasma generating device, having a high frequency generator which is provided outside the processing vessel and is configured to generate a high frequency wave, configured to generate the plasma within the processing vessel by using the high frequency wave generated by the high frequency generator. Here, the high frequency generator includes a high frequency oscillator configured to generate a high frequency wave; a waveguide configured to propagate the high frequency wave generated by the high frequency oscillator to the processing vessel serving as a load side; a power supply configured to supply a voltage to the high frequency oscillator; a traveling wave power measuring device configured to measure a power of a traveling wave that propagates to the load side; a reflected wave power measuring device configured to measure a power of a reflected wave reflected from the load side; and a voltage control device configured to control the voltage supplied to the high frequency oscillator by the power supply. Further, the voltage control device includes a load control device configured to supply, to the high frequency oscillator, a voltage corresponding to a power calculated by adding a power calculated based on the power of the reflected wave measured by the reflected wave power measuring device to the power of the traveling wave measured by the traveling wave power measuring device.

In this plasma processing apparatus, the voltage control device includes the load control device configured to supply, to the high frequency oscillator, the voltage corresponding to the power calculated by adding the power calculated based on the power of the reflected wave measured by the reflected wave power measuring device to the power of the traveling wave power measured by the traveling wave power measuring device. Accordingly, it may be possible to reduce a concern that a mode of a standing wave of a high frequency wave generated by the high frequency oscillator may jump to a low mode. Thus, a stable mode can be achieved in a short period of time. In such a case, an influence upon an effective load power, which is a power supplied to the load side, can be greatly reduced. As a result, it is possible to perform a stable plasma process more securely.

The load control device may be configured to control the power supply to supply a voltage corresponding to the sum of the power of the traveling wave measured by the traveling wave power measuring device and the power of the reflected wave measured by the reflective power measuring device.

The voltage control device may further include a subtracting circuit configured to calculate a difference between the power of the traveling wave measured by the traveling wave power measuring device and the power of the reflected wave measured by the reflected wave power measuring device.

The plasma processing apparatus may further include a holding table configured to hold the processing target object thereon; and a bias power application device configured to apply a bias power to the processing target object held on the holding table. Further, the bias power application device may be configured to perform a load control of the applied bias power.

The voltage control device may be configured to set a control operation start time by the load control device is equal to or less than about 50 μs.

The voltage control device may be configured to control a filament voltage supplied to the high frequency oscillator by the power supply depending on the supplied voltage.

The voltage control device may be configured to control the voltage supplied by the power supply such that the voltage falls within a preset power range allowed by the high frequency oscillator.

The voltage control device may further include a switching device configured to switch a circuit forming the load control device.

The voltage control device may further include a switching circuit configured to output a power signal to the high frequency oscillator from the power supply, and the switching circuit may include an insulated gate bipolar transistor or a field effect transistor.

The plasma generating device may include a dielectric window configured to transmit the high frequency wave generated by the high frequency oscillator into the processing vessel; and a slot antenna plate, having a plurality of slots, configured to radiate the high frequency wave to the dielectric window.

In another example embodiment, a plasma processing method of performing a process on a processing target substrate by using plasma processing apparatus including a processing vessel configured to perform therein the process by the plasma; and a plasma generating device, having a high frequency generator which is provided outside the processing vessel and is configured to generate a high frequency wave, configured to generate the plasma within the processing vessel by using the high frequency wave generated by the high frequency generator, the high frequency generator including a high frequency oscillator configured to generate a high frequency wave; a waveguide configured to propagate the high frequency wave generated by the high frequency oscillator to the processing vessel serving as a load side; a power supply configured to supply a voltage to the high frequency oscillator; and a voltage control device configured to control the voltage supplied to the high frequency oscillator by the power supply includes measuring a power of a traveling wave which propagates to the load side; measuring a power of a reflected wave reflected from the load side; and performing a load control of supplying, to the high frequency oscillator, a voltage corresponding to a power calculated by adding a power calculated based on the measured power of the reflected wave to the measured power of the traveling wave.

According to this plasma processing method, a load control of supplying, to the high frequency oscillator, a voltage corresponding to a power calculated by adding a power calculated based on the measured power of the reflected wave to the measured power of the traveling wave is performed. Accordingly, it may be possible to reduce a concern that a mode of a standing wave of a high frequency wave generated by the high frequency oscillator may jump to a low mode. Thus, a stable mode can be achieved in a short period of time. In such a case, an influence upon an effective load power, which is a power supplied to the load side, can be greatly reduced. As a result, it is possible to perform a stable plasma process more securely.

In the performing of the load control, the power supply may be controlled to supply a voltage corresponding to the sum of the power of the traveling wave and the power of the reflected wave.

In still another example embodiment, a high frequency generator configured to generate a high frequency power includes a high frequency oscillator configured to generate a high frequency wave; a traveling wave power measuring device configured to measure a power of a traveling wave that propagates to a load side; a reflected wave power measuring device configured to measure a power of a reflected wave reflected from the load side; a power supply configured to supply a voltage to the high frequency oscillator; and a voltage control device configured to control the voltage supplied to the high frequency oscillator. Further, the voltage control device includes a load control device configured to supply, to the high frequency oscillator, a voltage corresponding to a power calculated by adding a power calculated based on the power of the reflected wave measured by the reflected wave power measuring device to the power of the traveling wave measured by the traveling wave power measuring device.

In this high frequency generator, the voltage control device includes the load control device configured to supply, to the high frequency oscillator, the voltage corresponding to the power calculated by adding the power calculated based on the power of the reflected wave measured by the reflected wave power measuring device to the power of the traveling wave power measured by the traveling wave power measuring device. Accordingly, it may be possible to reduce a concern that a mode of a standing wave of a high frequency wave generated by the high frequency oscillator may jump to a low mode. Thus, a stable mode can be achieved in a short period of time. In such a case, an influence upon an effective load power, which is a power supplied to the load side, can be greatly reduced. As a result, it is possible to perform a stable plasma process more securely.

The load control device may be configured to control the power supply to supply a voltage corresponding to the sum of the power of the traveling wave measured by the traveling wave power measuring device and the power of the reflected wave measured by the reflective power measuring device.

In accordance with the plasma processing apparatus having the above-described configuration, the voltage control device includes the load control device configured to supply, to the high frequency oscillator, the voltage corresponding to the power calculated by adding the power calculated based on the power of the reflected wave measured by the reflected wave power measuring device to the power of the traveling wave power measured by the traveling wave power measuring device. Accordingly, it may be possible to reduce a concern that a mode of a standing wave of a high frequency wave generated by the high frequency oscillator may jump to a low mode. Thus, a stable mode can be achieved in a short period of time. In such a case, an influence upon an effective load power, which is a power supplied to the load side, can be greatly reduced. As a result, it is possible to perform a stable plasma process more securely.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 8A to FIG. 8C are graphs showing examples of a relationship between an elapsed time and a power in the traveling wave power control when supplying a microwave power in the conventional case;

FIG. 9 is a graph showing a relationship between an electron density and an incident power of 2-dimensional planar microwave plasma in simulation of surface wave plasma;

FIG. 11A to FIG. 11C are graphs showing an example of a relationship between an elapsed time and a power in a load control when supplying the microwave power;

FIG. 12A to FIG. 12D are graphs showing another example of a relationship between an elapsed time and a power in a load control when supplying the microwave power;

FIG. 13A to FIG. 13D are graphs showing an example of a relationship between an elapsed time and a power in a load control upon the lapse of a preset time after supplying the microwave power;

FIG. 14 is a graph showing a relationship between an elapsed time and a plasma emission intensity when varying a microwave power;

DETAILED DESCRIPTION

Figure 1:
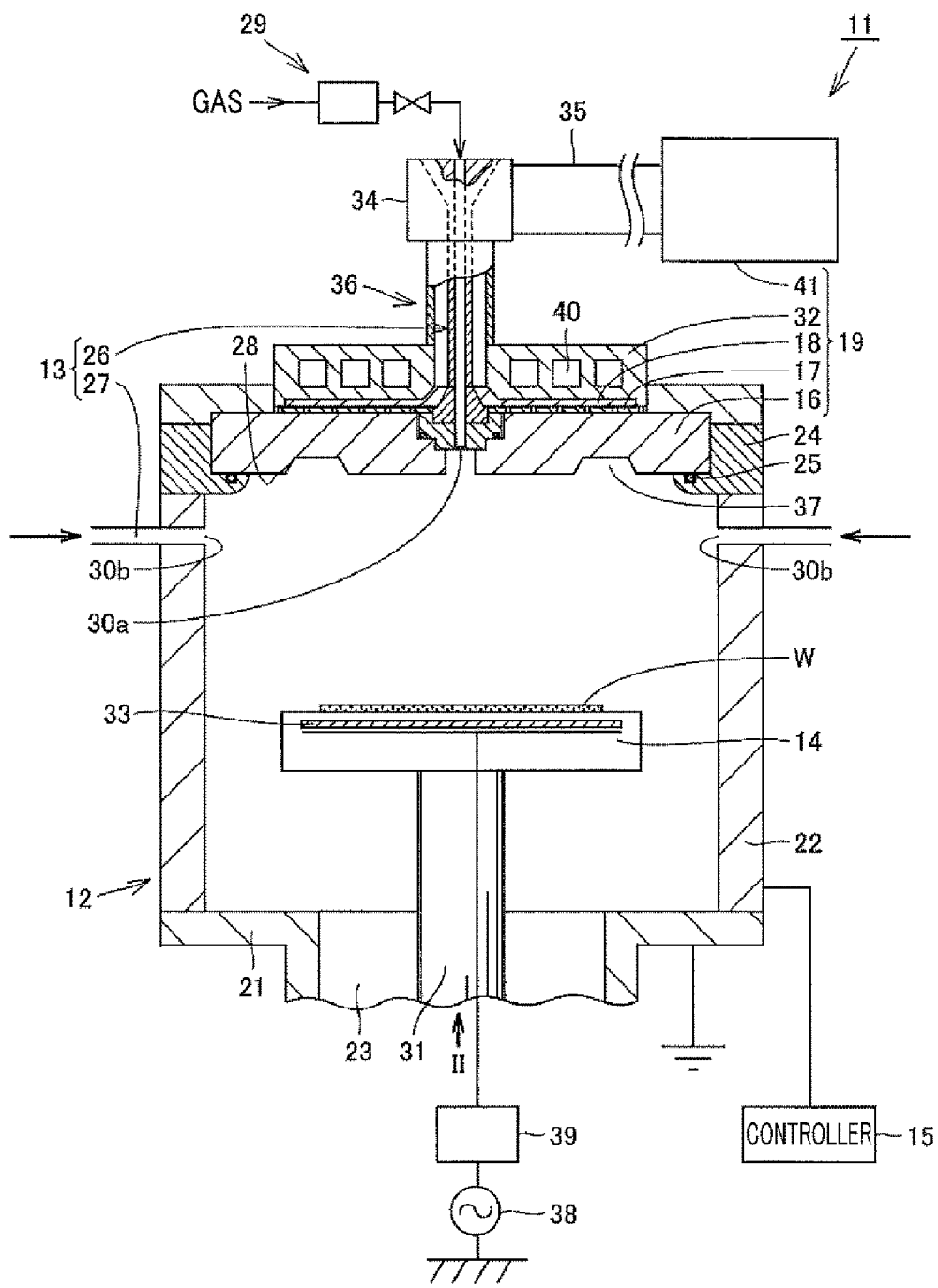
FIG. 1 is a schematic configuration view illustrating major parts of a plasma processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 2:
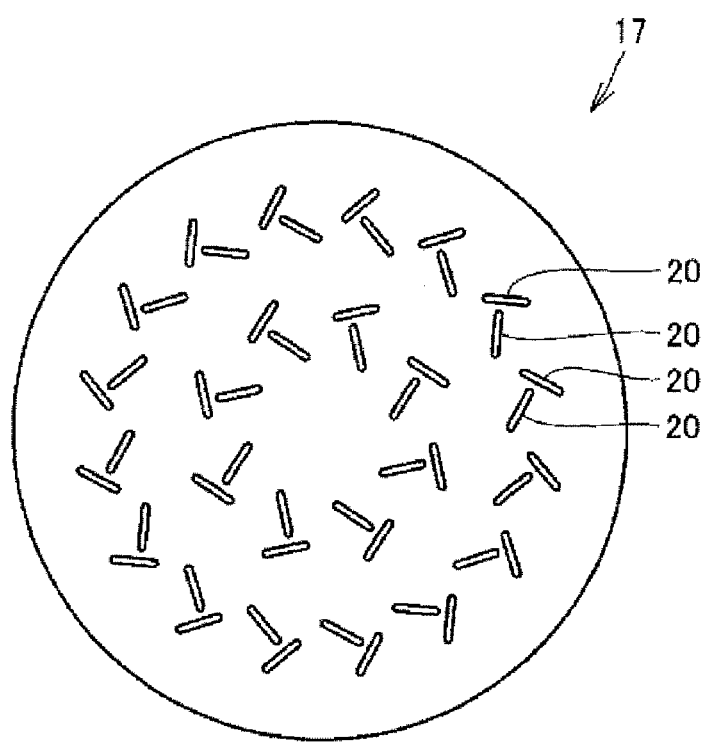
FIG. 2 is a schematic diagram of a slot antenna plate included in the plasma processing apparatus shown in FIG. 1, when viewed from a direction indicated by an arrow II of FIG. 1.

Hereinafter, example embodiments will be described with reference to the accompanying drawings, which form a part of the description. FIG. 1 is a schematic cross sectional view illustrating major components of a plasma processing apparatus in accordance with an example embodiment. FIG. 2 is a diagram showing a slot antenna plate included in the plasma processing apparatus shown in FIG. 1, when viewed from below the slot antenna plate, i.e., in a direction indicated by an arrow II of FIG. 1. In FIG. 1, hatching of a part of components is omitted for the sake of better understanding. Further, in this example embodiment, a vertical direction in the plasma processing apparatus accords to a vertical direction on a paper plane of FIG. 1, which is indicated by the arrow II of FIG. 1 or an opposite direction thereto.

Referring to FIG. 1 and FIG. 2, a plasma processing apparatus 11 is configured to perform a required process on a processing target substrate W by using plasma. Specifically, the plasma processing apparatus 11 is configured to perform a process such as etching, CVD or sputtering. The processing target substrate W may be, but not limited to, a silicon substrate for use in manufacturing a semiconductor device.

The plasma processing apparatus 11 includes a processing vessel 12 configured to perform therein a plasma process on the processing target substrate W; a gas supplying unit 13 configured to supply a gas for plasma excitation or a plasma processing gas into the processing vessel; a circular plate-shaped holding table 14 provided in the processing vessel 12 and configured to hold thereon the processing target substrate W; a plasma generating device 19 configured to generate plasma within the processing vessel 12 by using a microwave; and a controller 15 configured to control an overall operations of the plasma processing apparatus 11. The controller 15 controls the entire plasma processing apparatus 11 including a gas flow rate in the gas supplying unit 13, a pressure within the processing vessel 12, etc.

The processing vessel 12 includes a bottom 21 located under the holding table 14; and a sidewall 22 extended upward from a periphery of the bottom 21. The sidewall 22 has a substantially cylindrical shape. A gas exhaust hole 23 for gas exhaust is formed through a part of the bottom 21 of the processing vessel 12. A top side of the processing vessel 12 is opened, and the processing vessel 12 is hermetically sealed by a cover 24 provided on the top side of the processing vessel 12, a dielectric window 16 to be described later, and an O-ring 25 as a sealing member provided between the dielectric window 16 and the cover 24.

The gas supplying unit 13 includes a first gas supplying unit 26 configured to discharge a gas toward a central portion of the processing target substrate W; and a second gas supplying unit 27 configured to discharge a gas from an outside of a periphery of the processing substrate W. A gas supply hole 30a for supplying the gas in the first gas supplying unit 26 is formed at a central portion of the dielectric window 16 in a diametrical direction thereof to be located at a position higher than a bottom surface 28 of the dielectric window 16, which faces the holding table 14. The first gas supplying unit 26 is configured to supply an inert gas for plasma excitation or a plasma processing gas while controlling a flow rate of the gas by a gas supply system 29 connected to the first gas supplying unit 26. The second gas supplying unit 27 is implemented by a multiple number of gas supply holes 30b through which the inert gas for plasma excitation or the plasma processing gas is supplied into the processing vessel 12. The gas supply holes 30b are formed in a part of an upper portion of the sidewall 22 and arranged at a regular distance therebetween in a circumferential direction. A same kind of inert gas for plasma excitation or a same kind of plasma processing gas may be supplied to the first and second gas supplying units 26 and 27 from a single gas supply source. In response to a request or depending on the content of control, it may be possible to supply different gases to the first and second gas supplying unit 26 and 27 while controlling a flow rate ratio therebetween.

A high frequency power supply 38 for RF (Radio Frequency) bias is electrically connected to an electrode within the holding table 14 via a matching unit 39. The high frequency power supply 38 is configured to output a high frequency power of, e.g., about 13.56 MHz at a preset power (bias power). The matching unit 39 includes a matcher configured to match an impedance at the side of the high frequency power supply 38 and an impedance at a load side such as the electrode or the processing vessel 12. A blocking capacitor for generating a self bias is included in the matcher. When necessary, a bias voltage is applied to the holding table 14 during a plasma process. Here, the bias voltage is applied under the control of the controller 15. In such a case, the controller 15 may serve as a bias voltage application device. The supply of the bias voltage to the holding table 14 will be described in detail later.

The holding table 14 is configured to hold thereon the processing target substrate W by an electrostatic chuck (not shown). Further, the holding table 14 includes a heater (not shown) for heating, or the like. A temperature of the holding table 14 can be set to a required temperature by a temperature control device 33 provided within the holding table 14. The holding table 14 is supported on an insulating cylindrical supporting member 31 uprightly extended from the bottom 21. The gas exhaust hole 23 is formed through a part of the bottom 21 of the processing vessel 12 along a periphery of the cylindrical supporting member 31. This annular gas exhaust hole 23 is connected via a gas exhaust line (not shown) to a gas exhaust device (not shown) which is provided under the gas exhaust hole 23. The gas exhaust device includes a vacuum pump such as a turbo molecular pump. The inside of the processing vessel 12 may be depressurized to a preset pressure by the gas exhaust device.

The plasma generating device 19 is provided outside the processing vessel 12, and includes a microwave generator 41 configured to generate a microwave for plasma excitation. Further, the plasma generating device 19 is located at a position facing the holding table 14 and further includes the dielectric window 16 through which the microwave generated by the microwave generator 41 is introduced into the processing vessel 12. The plasma generating device 19 further includes a slot antenna plate 17 provided on the dielectric window 16. The slot antenna 17 includes a multiple number of slots 20 and is configured to radiate the microwave to the dielectric window 16. In addition, the plasma generating device 19 also includes a dielectric member 18 provided on the slot antenna plate 17 and configured to propagate the microwave, which is introduced through a coaxial waveguide 36, in a diametrical direction thereof.

The microwave generator 41 is connected to an upper portion of the coaxial waveguide 36 via a waveguide 35 and a mode converter 34. By way of example, a microwave in a TE mode generated by the microwave generator 41 is converted into a TEM mode within the waveguide 35 by the mode converter 34, and, then, the microwave in the TEM mode is propagated in the coaxial waveguide 36. A detailed configuration of the microwave generator 41 will be described below. With respect to the microwave generator 41, the side on which the waveguide 35 is located is a load side to be described later.

The dielectric window 16 has a substantially circular plate shape and is made of a dielectric material. An annular recess 37 depressed in a tapered shape is formed on a part of the bottom surface 28 of the dielectric window 16 in order to facilitate generation of a standing wave by the introduced microwave. By providing the recess 37, it is possible to efficiently generate plasma under the dielectric window 16 with the microwave. The dielectric window 16 may be made of, but not limited to, quartz or alumina.

The slot antenna plate 17 is a thin circular plate. The multiple number of slots 20 are provided to be pairs of two slots 20, as depicted in FIG. 2. In each slot pair, the two slots 20 are arranged to orthogonal to each other with a certain gap therebetween. These slot pairs are arranged at a regular distance in a circumferential direction and at a regular distance in a diametrical direction as well.

The microwave generated by the microwave generator 41 is propagated to the dielectric member 18 through the coaxial waveguide 36. The microwave is diffused radially outward within the dielectric member 18 which is provided between a cooling jacket 32 and the slot antenna plate 17, and, then, the microwave is radiated to the dielectric window 16 through the slots 20 of the slot antenna plate 17. The cooling jacket 32 has therein a circulation path 40 for circulating therethrough a coolant or the like and is configured to adjust a temperature of the dielectric member 18 or the like. The microwave transmitted through the dielectric window 16 generates an electric field directly under the dielectric window 16 and generates plasma within the processing vessel 12.

When generating microwave plasma in the plasma processing apparatus 11, a so-called "plasma generation region", in which an electron temperature of the plasma is relatively high, is formed in a region directly under the bottom surface 28 of the dielectric window 16, specifically, in a region distanced about several centimeters from the bottom surface 28 of the dielectric window 16. Under this plasma generation region, a so-called "plasma diffusion region", in which the plasma generated in the plasma generation region is diffused, is formed. An electron temperature of the plasma is relatively low in the plasma diffusion region, and the plasma process is performed in this space. With this configuration, it is possible to perform the plasma process efficiently without causing a so-called "plasma damage" on the processing target substrate W during the plasma process.

The plasma generating device 19 includes the dielectric window 16 configured to transmit a high frequency wave generated by a magnetron, serving as a high frequency oscillator to be described later, into the processing vessel 12; and the slot antenna plate 17 having the multiple number of slots 20 and configured to radiate the high frequency wave to the dielectric window 16. In the plasma generating device 19, the plasma is generated by the radial line slot antenna.

Figure 3:
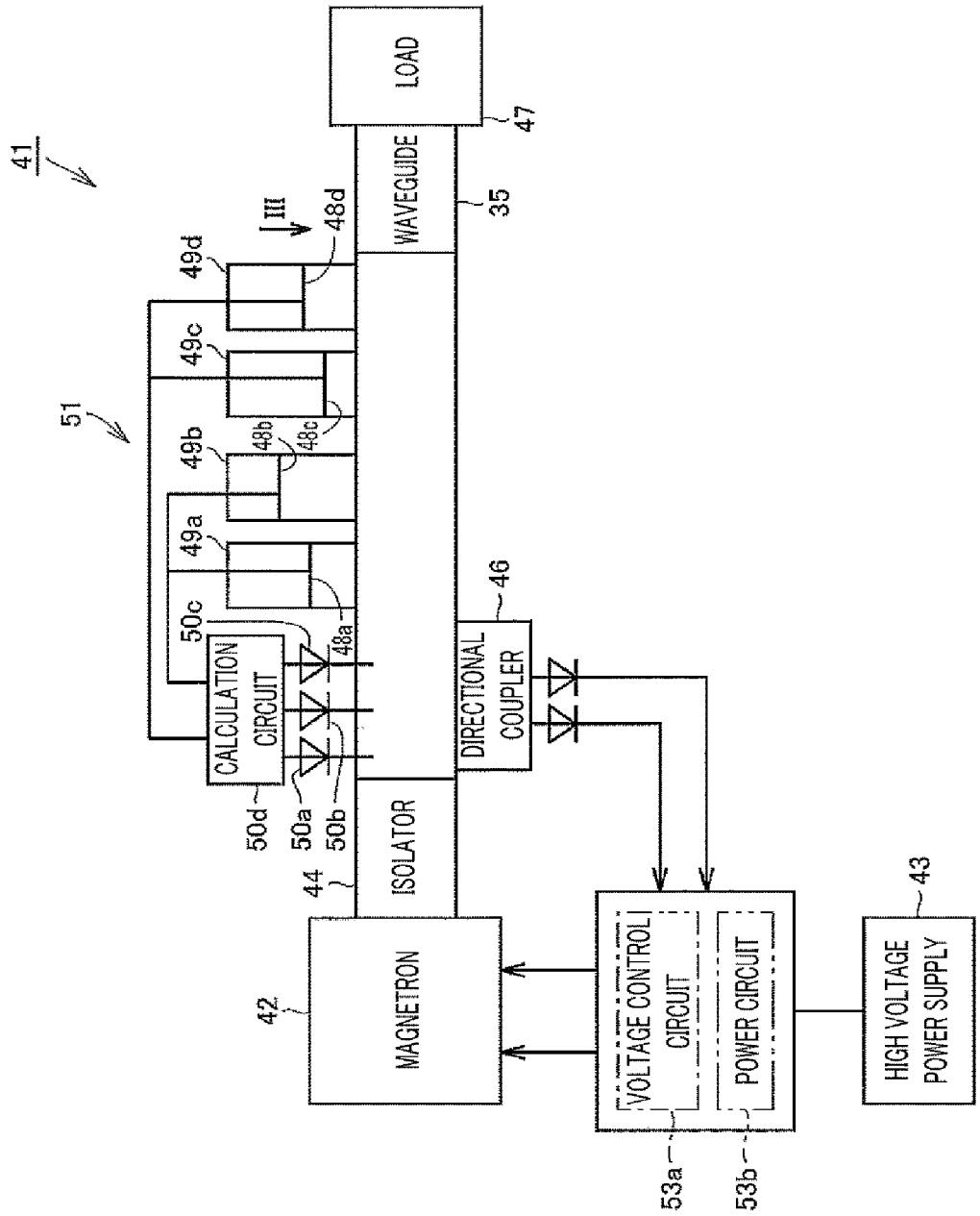
FIG. 3 is a schematic diagram illustrating a configuration in the vicinity of a 4E tuner included in a matching device of a microwave generator.
Figure 4:
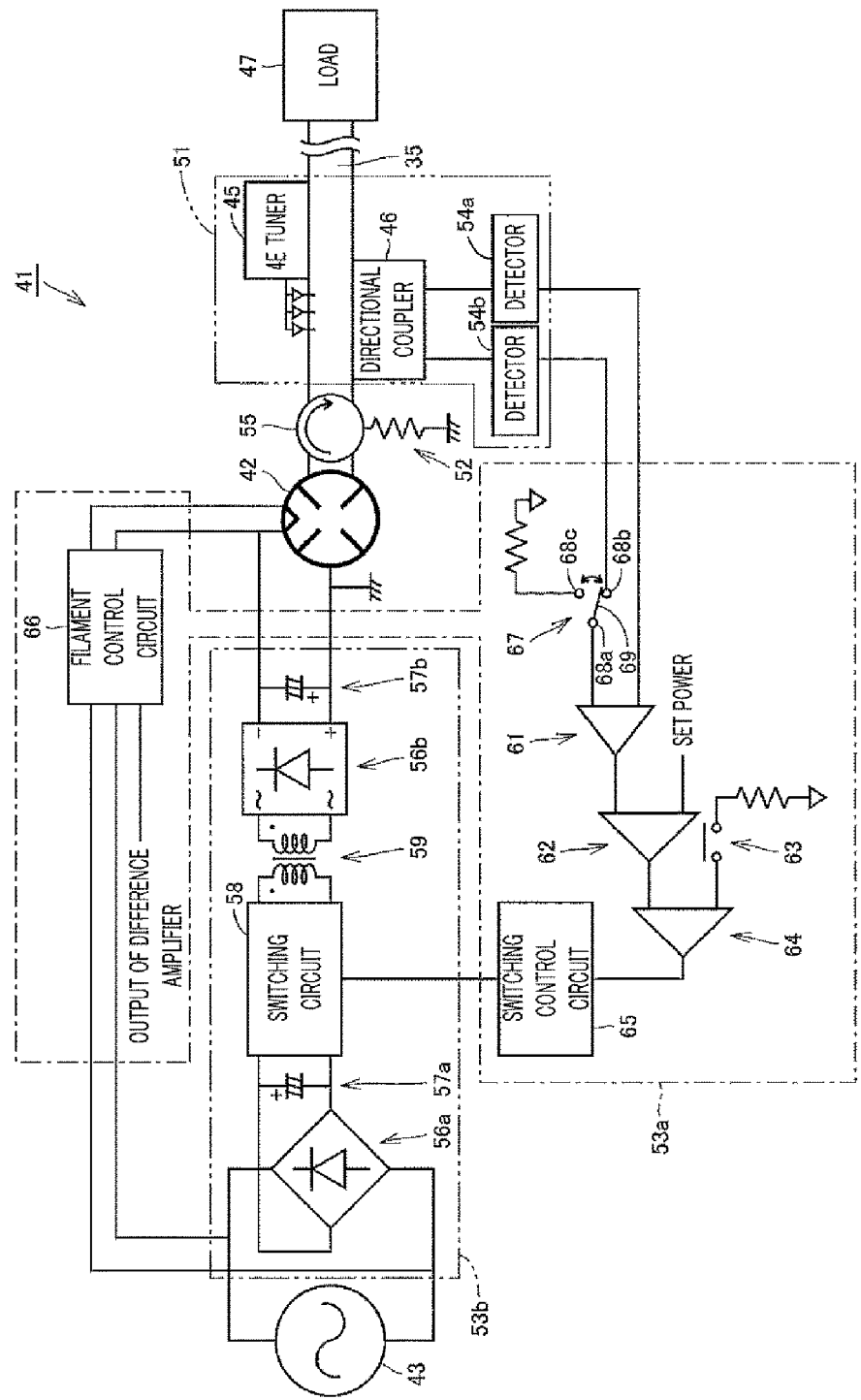
FIG. 4 is a schematic diagram illustrating a configuration of a voltage control circuit included in the microwave generator.

Here, a specific configuration of the microwave generator 41 included in the plasma generating device 19 of the plasma processing apparatus 11 having the above-described configuration will be explained. FIG. 3 is a schematic diagram illustrating components in the vicinity of a 4E tuner included in the matching device of the microwave generator 41. FIG. 4 is a schematic diagram illustrating a configuration of a voltage control circuit to be described later, which is included in the microwave generator 41.

Referring to FIG. 1 to FIG. 4, the microwave generator 41 includes a magnetron 42 serving as a high frequency oscillator configured to generate a high frequency wave; a matching device 51, a high voltage power supply 43 configured to supply, e.g., an anode voltage to the magnetron 42; a power circuit 53b configured to control the power supplied from the high voltage power supply 43; and an isolator 44 connected to the magnetron 42. The matching device 51 includes a 4E tuner 45 connected to the isolator 44; a directional coupler 46 connected to the 4E tuner 45; and detectors 54a and 54b to be described later. The isolator 44 transmits a frequency signal in one direction to the 4E tuner 45 located at the side of a load 47 from the magnetron 42. Here, the load 47 is a member, such as the mode converter 34, which is located downstream of the waveguide 35.

The 4E tuner 45 includes four movable short-circuit units 49a, 49b, 49c and 49d having four movable short-circuit plates 48a, 48b, 48c and 48d, respectively; and three probes 50a, 50b and 50c provided at the side of the magnetron 42 with respect to the movable short-circuit unit 49a. The four movable short-circuit plate 48a to 48d are arranged at a regular distance therebetween in a microwave propagating direction. The three probes 50a, 50b and 50c are arranged to be spaced apart from each other at a distance of about ⅛ of a basic frequency ($\lambda$), i.e., at a distance of about $\lambda/8$ in the microwave propagating direction. Further, a calculation circuit 50d connected to the three probes 50a, 50b and 50c calculates positions of the movable short-circuit plates 48a to 48d of the movable short-circuit units 49a to 49d from voltage values of the three probes 50a to 50c, and positioning of the movable short-circuit plates is performed. Specifically, the positioning of the four movable short-circuit plates 48a to 48d may be performed by moving the movable short-circuit plate 48a to 48d in a direction indicated by an arrow III of FIG. 3 or in an opposite direction thereto by rotating ball screws (not shown) configured to be driven through a non-illustrated motor. Since the positioning of the movable short-circuit plates 48a to 48d is performed by driving such mechanical components, it may take at least about 100 milliseconds to start moving the movable short-circuit plates 48a to 48d during a matching process, i.e., during a so-called tuning operation. Further, it may take at least about 1 sec to complete the matching.

In the isolator 44 provided between the magnetron 42 and the 4E tuner 45, one of terminals of, e.g., a circulator 55 serving as a passive device is set as a dummy load. That is, among three terminals of the circulator 55, a first terminal located at the side of the magnetron 42 is connected to the magnetron 42; a second terminal located at the side of the 4E tuner 45 is connected to the 4E tuner 45; and a third terminal is connected to a dummy load 52. With this configuration, the isolator 44 is capable of transmitting a frequency signal in one direction from the magnetron 42 to the 4E tuner 45 located at the side of the load 47.

The directional coupler 46 is provided at the side of the magnetron 42 with respect to the movable short-circuit unit 49a. This directional coupler 46 is a bi-directional coupler. As for the arrangement position of the directional coupler 46, the directional coupler 46 may be positioned to face or not to face the three probes 50a, 50b and 50c. By using the directional coupler 46, power signals of a traveling wave and a reflected wave propagating in the waveguide 35 including the 4E tuner 45 are outputted to the voltage control circuit 53a which serves as a voltage control device provided in the microwave generator 41. The power signals of the traveling wave and the reflected wave are detected by the detectors 54a and 54b, respectively, which are configured to detect the powers as signals. The anode voltage supplied to the magnetron 42 is controlled by the voltage control circuit 53a and the power circuit 53b. Further, a filament voltage is also controlled by the voltage control circuit 53a which includes a filament control circuit 66. The control through the voltage control circuit 53a will be elaborated later. In FIG. 4, the voltage control circuit 53a is indicated by a dashed dotted line, and the matching device 51 is indicated by a dashed triple-dotted line. Here, the detector 54a serves as a traveling wave power measuring device configured to measure a power of the traveling wave that propagates toward the load side, whereas the detector 54b serves as a reflected wave power measuring device configured to measure a power of the reflected wave reflected from the load side. The directional coupler 46 constitutes parts of the traveling wave power measuring device and reflected wave power measuring device.

Now, a configuration of the power circuit 53b included in the microwave generator 41 will be explained. The power circuit 53b includes a first full-wave rectifier bridge 56a configured to covert, for example, an AC voltage of, e.g., about 200 V supplied from the high voltage power supply 43 into a DC voltage of, e.g., about 280 V; a first smoothing capacitor 57a; a switching circuit 58 connected to the first smoothing capacitor 57a; a step-up transformer 59 configured to step up a voltage of a signal switched by the switching circuit 58 to, e.g., about 7.5 kV; a second full-wave rectifier bridge 56b configured to rectify the signal stepped up to the high voltage by the step-up transformer 59; and a second smoothing capacitor 57b. The switching circuit 58 may be implemented by, but not limited to, a FET (Field Effect Transistor), or an IGBT (Insulated Gate Bipolar Transistor) which has a breakdown voltage and is suitable for a large current. Further, power circuit 53b is indicated by a dashed double-dotted line.

Now, a configuration of the voltage control circuit 53a included in the microwave generator 41 will be discussed. The voltage control circuit 53a includes a subtracting circuit 61 configured to perform subtraction by inputting the power signals of the traveling wave and the reflected wave received from the directional coupler 46 through the detectors 54a and 54b; a difference amplifier 62 configured to amplify a difference between an output signal from the subtracting circuit 61 and a set power; a switch 64 configured to connect the signal amplified by the difference amplifier 62 to an ON/OFF circuit 63; and a switching control circuit 65 configured to change an ON time or a phase in the ON/OFF circuit 63 and send a control signal to the switching circuit 58. The subtracting circuit 61 is configured to subtract the reflected wave power from the traveling wave power and output the calculated difference therebetween as an output signal. The switching control circuit 65 sends a control signal to the switching circuit 58 such that the calculated difference is added to be outputted. In the voltage control circuit 53a, a control operation start time by a load control device may be set to be equal to or less than, e.g., about 60 μs. That is, a timing for supplying, from the high voltage power supply 43, an anode voltage corresponding to the sum of the traveling wave power measured by the detector 54a and the reflected wave power measured by the detector 54b is set to be delayed about 60 μs from a detected timing. Further, the voltage control circuit 53a also includes the filament control circuit 66 configured to calculate an optimal filament voltage by using an output of the difference amplifier 62 and control a filament voltage supplied to a cathode of the magnetron 42 form the high voltage power supply 43. The filament control circuit 66 is configured to calculate an optimal filament voltage from the output of the difference amplifier 62 and send a signal to the cathode of the magnetron 42.

Further, the voltage control circuit 53a further includes a changeover switch 67 configured to control an input of the power signal of the reflected wave to the subtracting circuit 61. To elaborate, by connecting terminals 68a and 68b through the changeover switch 67, the power signal of the reflected wave is allowed to be inputted to the subtracting circuit 61. Meanwhile, by connecting terminals 68a and 68c through the changeover switch 67, the power signal of the reflected wave is controlled not to be inputted to the subtracting circuit 61. FIG. 4 illustrates a state in which the terminals 68a and 68b are connected through the changeover switch 67, and the power signal of the reflected wave is inputted to the subtracting circuit 61.

The plasma processing apparatus and the microwave generator included therein are configured as described above. In this configuration, the voltage control circuit 53a includes the load control device configured to supply an anode voltage, which corresponds to a power calculated by adding a power calculated based on the reflected wave power measured by the detector 54b to the traveling wave power measured by the detector 54a, to the magnetron 42. Accordingly, it may be possible to reduce a concern that a mode of a standing wave of a high frequency wave generated by the magnetron 42 may jump to a low mode. Thus, a stable mode can be achieved in a short period of time. In such a case, an influence upon an effective load power, which is a power supplied to the load 47, can be greatly reduced. As a result, it is possible to perform a stable plasma process more securely.

In this example embodiment, the load control device is configured to control the high voltage power supply 43 to supply an anode voltage corresponding to a power calculated by adding the reflected wave power measured by the detector 54b to the traveling wave power measured by the detector 54a. Accordingly, it is possible to maintain the effective load power supplied to the load 47 constant.

Further, in this case, the voltage control circuit 53a includes the subtracting circuit 61 configured to calculate the difference between the traveling wave power measured by the detector 54a and the reflected wave power measured by the detector 54b. Accordingly, it is possible to calculate a more appropriately added power.

In addition, in this case, the voltage control circuit 53a controls the filament voltage, which is supplied to the magnetron 42 from the high voltage power supply 43, based on the supplied anode voltage. Accordingly, it is possible to supply the anode voltage and the filament voltage to the magnetron 42 more appropriately.

Now, the stable plasma process more securely performed in the plasma processing apparatus and the microwave generator in accordance with the present example embodiment will be described in detail. When generating a microwave by using a high frequency oscillator such as the magnetron 42 employed by the present inventors, the followings are assumed.

Figure 5:
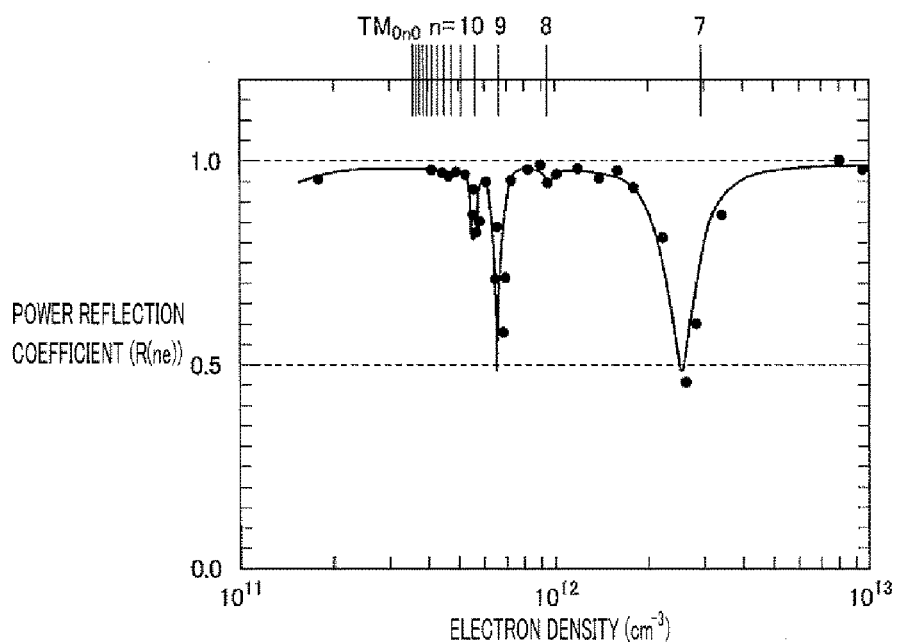
FIG. 5 is a graph showing a relationship between a power reflection coefficient and an electron density in simulation of surface wave plasma.
Figure 6:
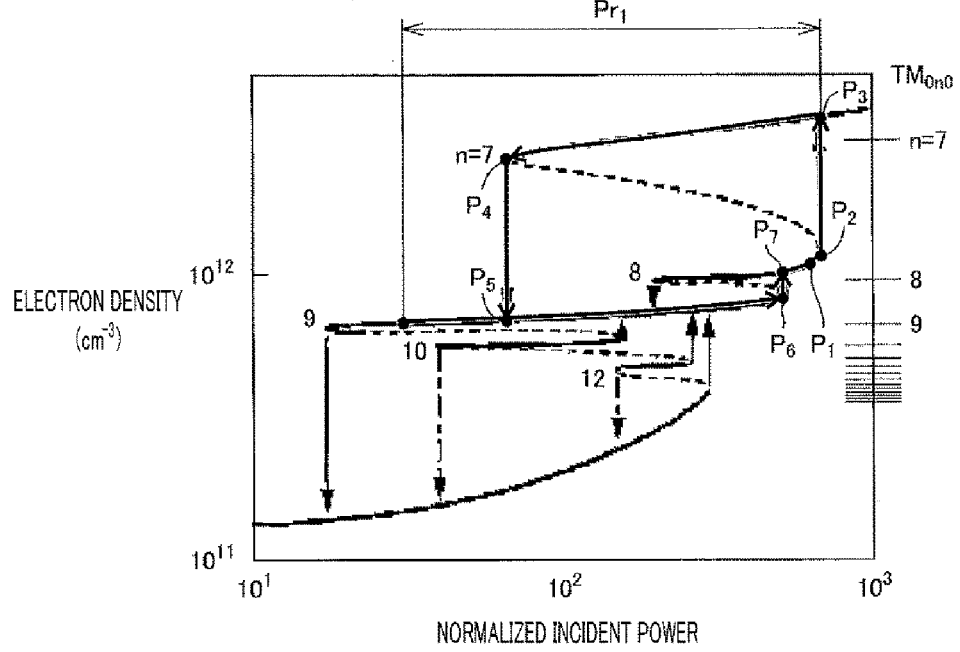
FIG. 6 is a graph showing a relationship between an electron density and an incident power of 2-dimensional planar microwave plasma in simulation of surface wave plasma.

FIG. 5 is a graph showing a relationship between a power reflection coefficient and an electron density in simulation of surface wave plasma. In FIG. 5, a vertical axis represents a power reflection coefficient (R(Ne)). A horizontal axis on the lower side of the graph represents an electron density ($cm^{-3}$), and a horizontal axis on the upper side of the graph represents a value of a TM (Transverse Magnetic) mode of a stable standing wave. The graph shows that a TM mode having a lower power reflection coefficient is more stable. A solid line in FIG. 5 indicates an analysis result, and multiple dots in FIG. 5 indicate FDTD (Finite Difference Time Domain method) simulation. FIG. 5 and FIG. 6 and FIG. 9 to be described later are extracted from "Chapter 4. Modeling and Simulation for Plasma Generation" ("Microwave Plasma Technology" by Institute of Electrical Engineers and Committee for Research of Microwave Plasma, OHMSHA, Japan).

Referring to FIG. 5, TM modes having integer values from 7 to 10 are depicted. As can be seen from FIG. 5, a TM mode having a lower power reflection coefficient is more stable. In this case, the power reflection coefficient is found to be especially low when n=7 and n=9. That is, when n=7 or n=9, more stable plasma may be generated.

Now, a relationship between an electron density and an incident power of 2-dimensional planar microwave plasma. FIG. 6 is a graph showing a relationship between an electron density and an incident power of 2-dimensional planar microwave plasma in simulation of surface wave plasma. In FIG. 6, a vertical axis indicates an electron density ($cm^{-3}$), and a horizontal axis indicates a normalized incident power. The normalized incident power is a value determined as Pf (traveling wave power)/Pc (constant) and also called an effective load power. Here, Pc (constant) is a constant determined by, for example, a volume of a processing vessel, a kind or a pressure of a gas used in generating plasma, etc. The normalized incident power increases as the traveling wave power, which is an incident power, increases. As for the vertical axis, the vertical axis on the left side of the graph indicates an electron density, and a vertical axis on the right side indicates a value of a TM mode of a stable standing wave. Further, FIG. 6 also depicts arrows indicating points of mode jumps and transition of the mode jumps in a conventional control operation.

Referring to FIG. 6, a single normalized incident power may have a multiple number of different electron densities. Though the normalized incident power is varied in each mode, a width maintained in the same mode is different. Further, as the normalized incident power increases, the electron density also increases basically. However, the electron density does not increase linearly but forms a so-called hysteresis curve. In such a case, depending on a mode of a standing wave, a multiple number of electron densities may exist as a stable mode.

Figure 7:
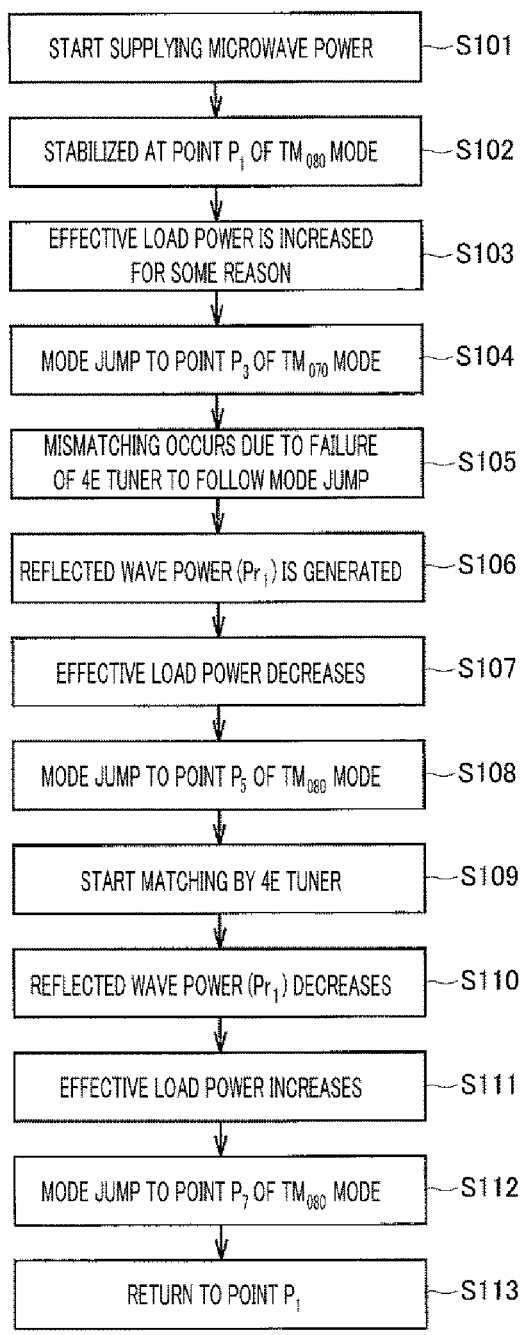
FIG. 7 is a flowchart for describing major processes of a traveling wave power control when supplying a microwave power in a conventional case.

Now, a conventional case of supplying a microwave power up to a set power level when performing a plasma process will be explained. In the conventional case, a traveling wave power control of monitoring and supplying only a traveling wave power without considering a reflected wave power is performed. FIG. 7 is a flowchart for describing major processes of the traveling wave power control when supplying a microwave power in the conventional case.

Referring to FIG. 6 and FIG. 7, a supply of a microwave power is started (block S101). If a normalized incident power, i.e., an effective load power increases, an electron density also increases. At a point $P_1$ of a $TM_{080}$ mode shown in FIG. 6, the mode of a standing wave is stabilized (block S102).

Thereafter, if the effective load power increases for some reasons (block S103), specifically, due to a variation in a pressure within the processing vessel or the like, the mode of the standing wave jumps to a point $P_3$ of a high $TM_{070}$ mode via a point $P_2$ (block S104). A time taken for the mode jump caused by the increase of the effective load power for some reasons is very short, less than, e.g., about 100 µs, though it varies depending on a kind or a pressure of a gas. Then, a matching operation by a 4E tuner is performed on this mode jump. Since, however, the 4E tuner is operated through the positioning by the movement of the mechanical components as mentioned above, the 4E tuner cannot follow the mode jump which is performed for the very short period of time. As a result, mismatching of reactance may be incurred in the waveguide (block S105), and a reflected wave power $Pr_1$ reflected from a load side is generated (block S106). This reflected wave power has a magnitude that is within a range indicated by bi-directional arrows in FIG. 6.

If the reflected wave power $Pr_1$ is generated, the effective load power is decreased accordingly (block S107). The effective load power may be decreased in an amount equivalent to a generation amount of the reflected wave power. To elaborate, the effective load power is equivalent to a value calculated by subtracting the reflected wave power from a traveling wave power. Then, there occurs a mode jump to a point $P_5$ of a high $TM_{090}$ mode via a point $P_4$ (block S108), and a matching operation by the 4E tuner is started (block S109). That is, a reactance matching by the positioning of the movable short-circuit plates or the like is performed. Through the reactance matching, the generated reflected wave power $Pr_1$ is gradually decreased (block 5110). As a result, the effective load power is gradually increased (block S111), and there occurs a mode jump to a point $P_7$ of a $TM_{080}$ mode via a point $P_6$ (block S112). Thereafter, as the effective load power further increases, the mode returns back to the point $P_1$ of the $TM_{080}$ mode (block S113).

As these operations are repeated, a so-called hunting may occur. Further, the above example is provided for the case where the effective load power increases for some reasons. However, the same phenomenon may occur if the reflected wave power is increased even when the effective load power is decreased for some reasons. The hunting may be caused through the above-described mechanism. When plasma emission detected in the processing vessel is brightened or darkened repeatedly, it may be determined that the hunting has occurred. Further, a spike, a phenomenon that plasma emission is momentarily darkened just one time without being darkened or brightened repeatedly, may be caused by the mode jump. In order to perform a stable plasma process, it may be desirable to minimize or remove such a phenomenon as the hunting or the spike.

Further, an example of a relationship between an elapsed time and a power detected by the detector will be described. FIG. 8A to FIG. 8C are graphs showing an example of a relationship between an elapsed time and a power in the traveling wave power control when supplying a microwave power in a conventional case. A bold line 71a in FIG. 8A represents a set traveling wave power; a bold line 71b in FIG. 8B, a detected traveling wave power; and a bold line 71c in FIG. 8C, a detected reflected wave power.

Referring to FIG. 8A, FIG. 8B and FIG. 8C, a power is supplied from a time $T_0$. In this case, as indicated by the bold line 71a, the power is supplied from the time $T_0$ such that the power reaches a set power $P_s$ at a time $T_1$ and is maintained constant at the set power $P_{s5}$ after the time $T_1$. Accordingly, as indicated by the bold line 71b, a traveling wave power 72a is detected from the time $T_0$ at the same timing as that indicated by the bold line 71a. The traveling wave power 72a reaches a traveling wave power $Pf_1$ at the time $T_1$ and is maintained constant thereafter. Here, a reflected wave power indicated by the bold line 71c is described. A reflected wave power 73a, which is equivalent to a reflected wave power $Pr_1$, is generated at a timing in the range from the time $T_0$ to the time $T_1$. Then, the reflected wave power approaches zero. Thereafter, reflected wave powers 73b, 73c and 73d, which are equivalent to a reflected wave power $Pr_2$, are generated for some reasons and are detected upon the lapse of certain times $T_2$, $T_3$ and $T_4$, respectively. These reflected wave powers 73a to 73d are just monitored. In this case, the effective load power after the time $T_0$ has a value of $Pf_1-Pr_1$ or a value of $Pf_1-Pr_2$, which are calculated by subtracting the reflected wave power 73a (to 73d) from the traveling wave power 72a. Accordingly, the effective load power is changed greatly.

Figure 10:
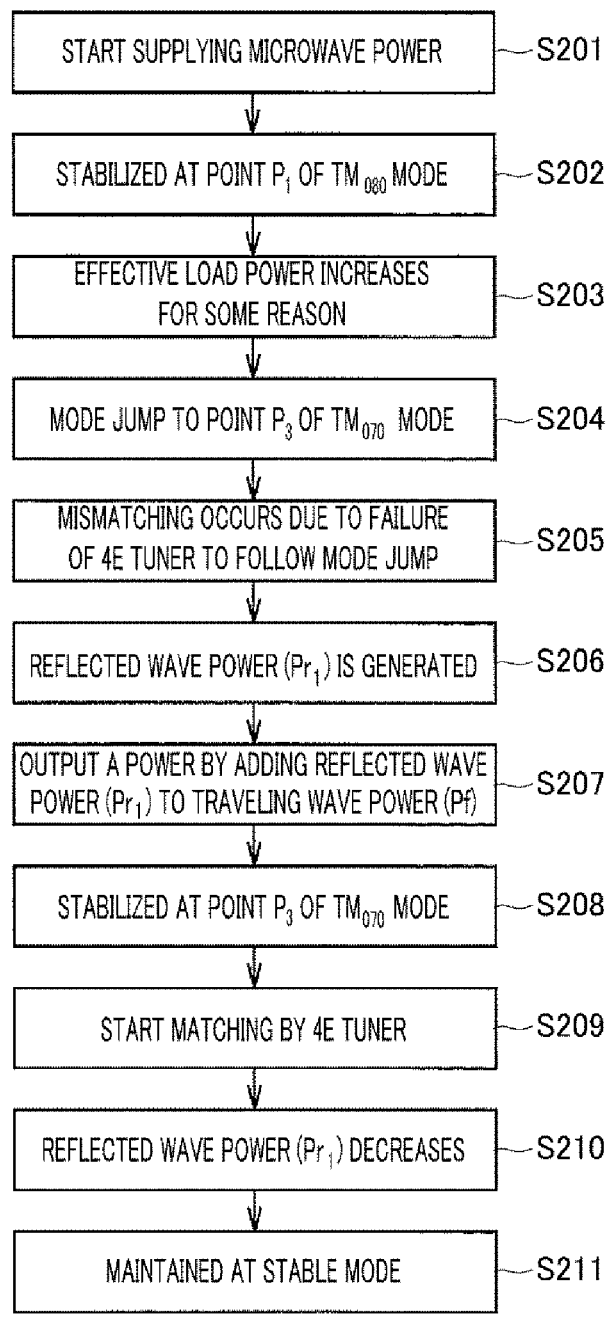
FIG. 10 is a flowchart for describing major processes when supplying a microwave power in case of using a plasma processing apparatus in accordance with an example embodiment.

Now, a case of supplying a microwave power by using the plasma processing apparatus in accordance with the example embodiment will be explained. FIG. 9 is a graph showing a relationship between an electron density and an incident power of a 2-dimensional planar microwave plasma in simulation of surface wave plasma. FIG. 10 is a flowchart for describing major processes when supplying a microwave power in case of using the plasma processing apparatus in accordance with the example embodiment. FIG. 9 also shows arrows indicating points of mode jumps and transition of the mode jumps in this control operation.

Referring to FIG. 9 and FIG. 10, a supply of a microwave power is started (block S201). Then, if a normalized incident power, i.e., an effective load power increases, an electron density also increases. At a point $P_1$ of a $TM_{080}$ mode shown in FIG. 9, the mode of a standing wave is stable (block S202).

Thereafter, if the effective load power increases for some reasons (block S203). The mode of the standing wave jumps to a point $P_3$ of a high $TM_{070}$ mode via a point $P_2$ (block S204). Then, a matching operation by the 4E tuner is performed for this mode jump. Since, however, the 4E tuner is operated through the positioning by the movement of the mechanical components as mentioned above, the 4E tuner cannot follow the mode jump which is performed for a very short period of time. As a result, mismatching of reactance may be incurred in the waveguide (block S205), and a reflected wave power reflected from a load side is generated (block S206). These processes up to block S206 are the same as those of the conventional control operation shown in FIG. 7.

Here, if the reflected wave power is generated, a load control is performed. Through the load control, a power calculated by adding the reflective wave power to the traveling wave power is outputted (block S207). That is, there is performed a load control process in which an anode voltage corresponding to the sum of the traveling wave power and the reflected wave power is supplied. Through this load control, the effective load power can be maintained at the constant value. That is, even when the reflected wave power $Pr_1$ is generated, the effective load power does not decrease. As a result, unlike in the conventional case, a mode jump to the point $P_5$ of the low $TM_{090}$ mode does not take place, but the mode is maintained at the $TM_{070}$ mode (block S208). Thereafter, a matching operation by the 4E tuner is started (block S209). That is, reactance matching by the positioning of the movable short-circuit plates within the waveguide is performed. Through this reactance matching, the generated reflected wave power $Pr_1$ is reduced (block S210). In this case, since the power corresponding to the sum of the reduced reflected wave power and the traveling wave power is outputted, the effective load power can be still maintained at the constant value. As a consequence, a mode jump to a low mode may not take place, and a stable mode can be maintained.

Further, an example of detected powers will be explained as follows. FIG. 11A to FIG. 11C are graphs showing an example of a relationship between an elapsed time and a power in a load control performed when supplying a microwave power. A bold line 71d in FIG. 11A indicates a set load power; a bole line 71e in FIG. 11B, a detected traveling wave power; and a bold line 71f in FIG. 11C, a detected reflected wave power.

Referring to FIG. 11A, FIG. 11B and FIG. 11C, a power is supplied from a time $T_0$. In this case, the power is supplied from the time $T_0$ such that the power reaches a set power $P_s$ at a time $T_1$ and is maintained constant at the set power $P_s$ after the time $T_1$. As in the case shown in FIG. 8C, if a reflected wave power 73a, which is equivalent to a reflected wave power $Pr_1$, is generated at a timing in the range from the time $T_0$ to the time $T_1$, the generated reflected wave power 73a is detected by the detector 54b or the like. Then, through the load control, a difference between a traveling wave power and the reflected wave power is calculated by the subtracting circuit 61, and by adding the difference through the difference amplifier, an effective load power is controlled to be maintained constant. A traveling wave power 74a in this case is equivalent to a traveling wave power $Pf_2$, which is the sum of a traveling wave power $Pf_1$ and the reflected wave power $Pr_1$. Then, if reflected wave powers 73b, 73c and 73d, which are equivalent to a reflected wave power $Pr_2$, are generated for some reasons upon the lapse of certain times $T_2$, $T_3$ and $T_4$, respectively, the load control is also performed on these reflected wave powers. That is, differences between traveling wave powers and the reflected wave powers are calculated by the subtracting circuit 61, and by adding the differences, effective load powers are controlled to be maintained constant. That is, powers corresponding to the sum of the traveling wave powers and the reflected wave powers are supplied. In such a case, each of the traveling wave powers 74b, 74c and 74d is equivalent to a traveling wave power $Pf_3$ calculated by adding the reflected wave power $Pr_2$ to the traveling wave power $Pf_1$. Here, each effective load power has a power value of $Pf_2-Pr_1$ or a power value of $Pf_3-Pr_2$, which are calculated by subtracting the reflected wave powers 73a to 73d from the traveling wave powers 74a to 74d, respectively. The power value of $Pf_2-Pr_1$, the power value of $Pf_3-Pr_2$ and the power value $Pf_1$ are equal to the power value $P_s$ set as the effective load power. That is, the effective load power is maintained constant even when the reflected wave powers are generated.

Another example of detected powers will be described as follows. FIG. 12A to FIG. 12D are graphs showing another example of a relationship between an elapsed time and a power in a load control performed when supplying a microwave power. A bold line 71g in FIG. 12A indicates a set load power; a bold line 71h in FIG. 12B, a detected traveling wave power; and a bold line 71i in FIG. 12C, a detected reflected wave power. Further, a bold line 71j in FIG. 12D shows an operational status of the movable short-circuit plates of the 4E tuner. As for the operational status of the movable short-circuit plates, ON/OFF switching is depicted.

Referring to FIGS. 12A, 12B, 12C and 12D, a power is supplied from a time $T_0$. In this case, the power is supplied from the time $T_0$ such that the power reaches a set power $P_s$ at a time $T_1$ and is maintained constant at the set power $P_s$ throughout a time $T_3$ and a time $T_4$. Here, if a reflected wave power 76a, which is equivalent to a reflected wave power $Pr_1$, is generated at substantially the same timing as the time $T_0$, the load control is performed to supply a power calculated by adding the reflected wave power $Pr_1$ to a traveling wave power $Pf_1$, which is equivalent to the set power $P_s$ supplied when no reflected wave power is generated. That is, a voltage corresponding to the sum of the traveling wave power $Pf_1$ and the reflected wave power $Pr_1$ is supplied to the magnetron as an anode voltage. Accordingly, a traveling wave power $Pf_2$, which is detected from the time $T_0$ to the time $T_1$, is a power equivalent to the sum of the traveling wave power $Pf_1$ and the reflected wave power $Pr_1$. Then, the traveling wave power $Pf_2$ and the reflected wave power $Pr_1$ are detected until the time $T_3$. Upon the time $T_3$, the movable short-circuit plates are operated gradually, and a matching operation is started from the time $T_3$. Accordingly, the reflected wave power $Pr_1$ is gradually decreased from the time $T_3$ to a time $T_4$ by the matching operation of the 4E tuner. Upon reaching the time $T_4$, the reflected wave power $Pr_1$ is hardly detected. The matching operation by the 4E tuner is ended at the time $T_4$ when the reflected wave power $Pr_1$ almost reaches zero. In this way, the matching operation is performed while maintaining the effective load power constant. In this case, the period from the time $T_1$ to the time $T_3$ may be about 100 milliseconds at maximum, and the period from the time $T_3$ to the time $T_4$ may range from several hundreds of milliseconds to several seconds.

An example of powers detected upon the lapse of a preset time after supplying a microwave power will be described as follows. FIG. 13A to FIG. 13D are graphs showing an example of a relationship between an elapsed time and a power in a load control upon the lapse of a preset time after supplying the microwave power. A bold line 17k in FIG. 13A indicates a set load power; a bold line 71l in FIG. 13B, a detected traveling wave power; a bold line 71m in FIG. 13C, a detected reflected wave power. Further, a bold line 71n in FIG. 13D shows an operational status of the movable short-circuit plates of the 4E tuner. As for the operational status of the movable short-circuit plates, ON/OFF switching is depicted.

Referring to FIG. 13A, FIG. 13B, FIG. 13C and FIG. 13D, a set power Ps is already supplied in a stable state. A traveling wave power 79a detected at this time is maintained constant at a traveling wave power $Pf_1$. Here, if a reflected wave power 78a is generated for some reason in a time range from a time $T_1$ to a time $T_3$, a reflected wave power $Pr_1$ is detected. Then, an anode voltage corresponding to the sum of the traveling wave power $Pf_1$ and the reflected wave power $Pr_1$ is supplied to the magnetron from the time $T_1$. At this time, a traveling wave power $Pf_2$ is detected as the traveling wave power 79a. Then, upon the time $T_3$, the movable short-circuit plates are operated gradually, and a matching operation is started from the time $T_3$. Thereafter, the reflected wave power $Pr_1$ is gradually decreased from the time $T_3$ to a time $T_4$ due to the matching operation of the 4E tuner. Upon reaching the time $T_4$, the reflected wave power $Pr_1$ is hardly detected. The matching operation by the 4E tuner is ended at the time $T_4$ when the reflected wave power $Pr_1$ almost reaches zero. In this way, the matching operation is performed while maintaining the effective load power constant.

Now, a relationship between an elapsed time and a plasma emission intensity when varying a microwave power will be explained. FIG. 14 is a graph showing a relationship between an elapsed time and a plasma emission intensity when a microwave power is varied. In FIG. 14, a vertical axis represents an emission intensity (a.u.) at a wavelength of, e.g., about 656 nm of hydrogen in OES (Optical Emission Spectroscopy), and a horizontal axis represents an elapsed time (sec). In the OES measurement, an emission peak value is measured at the wavelength of about 656 nm, which indicates emission of hydrogen, when plasma is generated. In this case, processing conditions for the plasma generation are as follows: a pressure within the processing vessel is set to, e.g., about 60 mTorr; a mixture gas of He, HBr and $O_2$ is used as a processing gas; and a bias power is not applied. Further, in FIG. 14, a traveling wave power control is indicated by a dotted line 81a, whereas a load control is indicated by a solid line 81b. A supplied microwave power is set to, e.g., about 1000 W, about 1500 W, about 2000 W, about 2500 W and about 3000 W. Most of output values, specifically, in a range from about 1 sec to about 30 sec are detected in a region 82a under about 1000 W, a region 82b under about 1500 W, a region 82c under about 2000 W, a region 82d under about 2500 W and a region 82e under about 3000 W.

Referring to FIG. 14, as indicated by the dotted line 81a, in the traveling wave power control under about 2000 W, a peak that decreases rapidly is observed near about 11 sec to about 12 sec. It is highly likely that a mode jump may occur at this peak. After 12 sec, the output is slightly changed. In contrast, as indicated by the solid line 81b, in the load control under about 2000 W, although the output is slightly changed, a rapidly decreasing peak is not observed near about 11 sec to about 12 sec. That is, although a plasma emission intensity is affected by the generation of the reflected wave power, it is found that a possibility of a mode jump is very low because the plasma emission intensity is almost stabilized.

Figure 15:
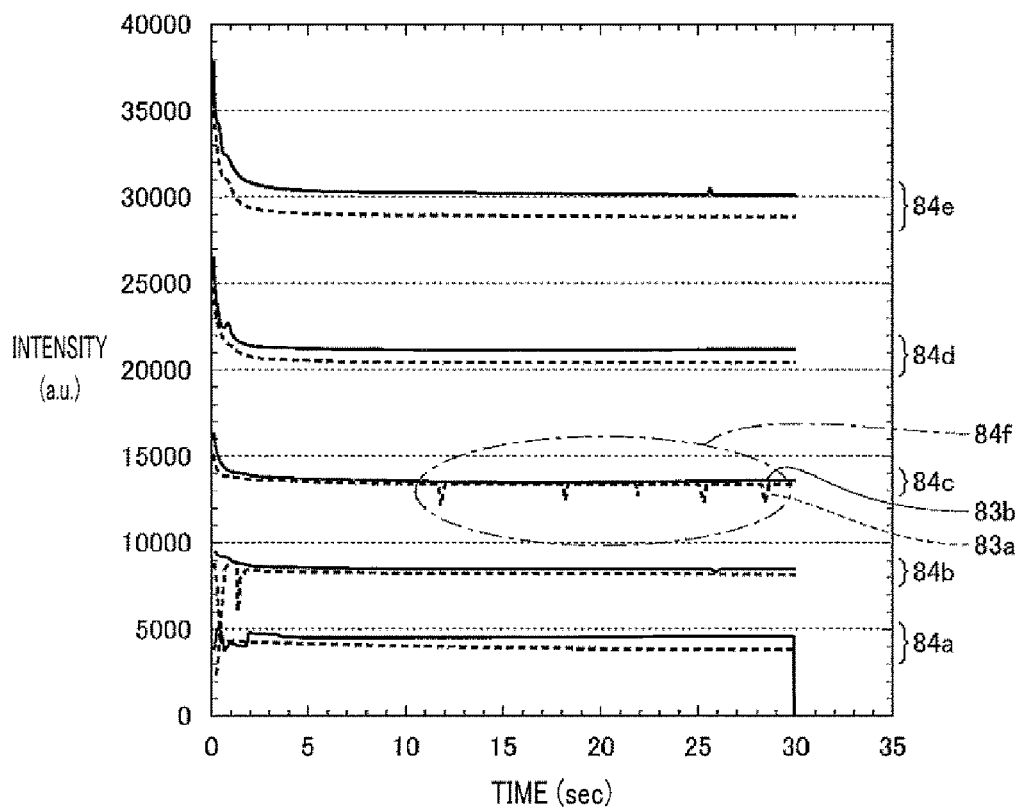
FIG. 15 is a graph showing a relationship between an elapsed time and a plasma emission intensity when varying a microwave power.

FIG. 15 is a graph showing a relationship between an elapsed time and a plasma emission intensity when a microwave power is varied. In FIG. 15, a vertical axis represents an emission intensity (a.u.) at a wavelength of, e.g., about 656 nm of hydrogen in OES, and a horizontal axis represents an elapsed time (sec). Processing conditions for plasma generation are the same as those described in FIG. 14 except that a pressure within the processing vessel is set to, e.g., about 100 mTorr. Further, in FIG. 15, a traveling wave power control is indicated by a dashed line 83a, whereas a load control is indicated by a solid line 83b. A supplied microwave power is set to, e.g., about 1000 W, about 1500 W, about 2000 W, about 2500 W and about 3000 W, as in the case of FIG. 14. Most of output values, specifically, in a range from about 1 sec to about 30 sec are detected in a region 84a under about 1000 W, a region 84b under about 1500 W, a region 84c under about 2000 W, a region 84d under about 2500 W and a region 84e under about 3000 W.

Referring to FIG. 15, in performing the traveling wave power control, the hunting occurs intermittently in a region 84f, which is indicated by a dashed dotted line of FIG. 15, when supplying a microwave power of about 2000 W, as indicated by the dotted line 83a. In contrast, in performing the load control, the hunting does not occur when supplying a microwave power of about 2000 W, as indicated by a solid line 83b. This is the same for the other supplied microwave powers. That is, this result shows that it is possible to remove the hunting by the load control under these processing conditions as well.

Further, a bias power application device may be configured to perform a load control of an applied bias power. That is, the microwave generator included in the plasma processing apparatus includes a holding table configured to hold thereon a processing target object; and a bias power application device configured to apply a bias power to the processing target object held on the holding table. The bias power application device performs a load control of an applied bias power. With this configuration, it is possible to stabilize plasma more securely.

Figure 16:
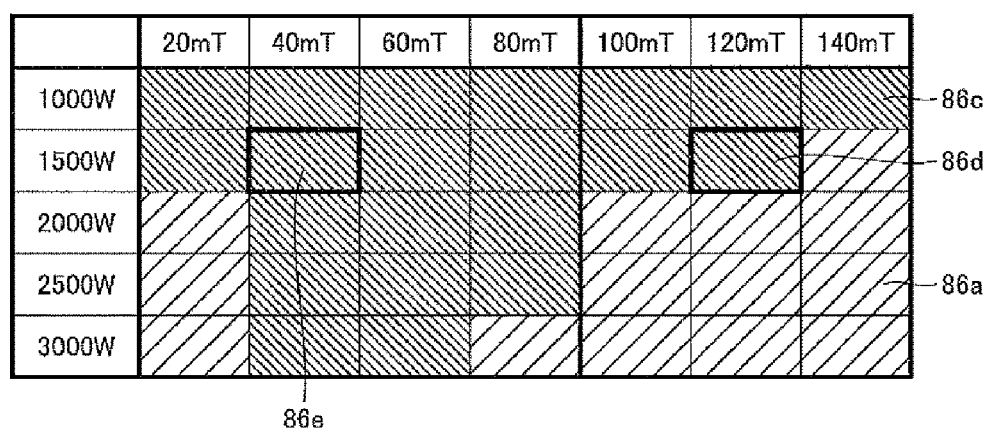
FIG. 16 is a table showing a stability degree of generated plasma depending on a pressure within a processing vessel and a supplied microwave power.
Figure 17:
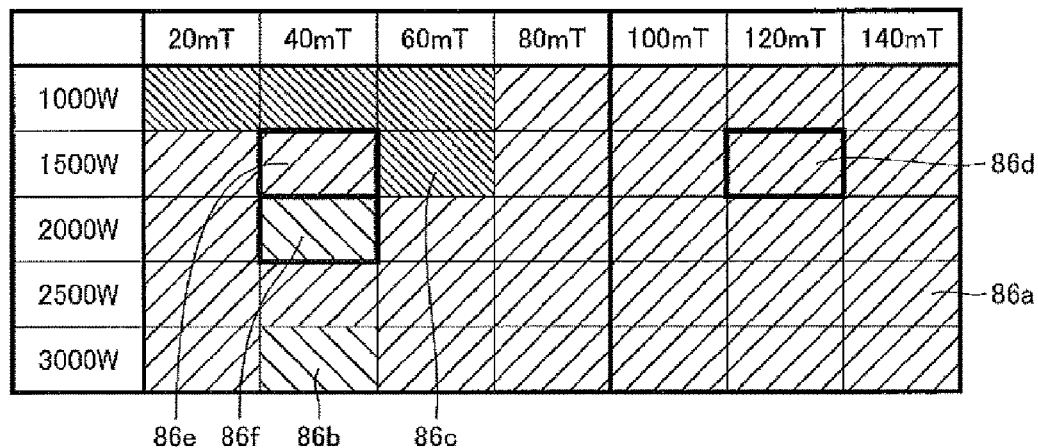
FIG. 17 is a table showing a stability degree of generated plasma depending on a pressure within a processing vessel and a supplied microwave power.

This effect related to the stability of plasma will be described as follows. FIG. 16 and FIG. 17 are tables showing a stability degree of generated plasma depending on a pressure within the processing vessel and a supplied microwave power. The table depicted in FIG. 16 is of a matrix shape in which a horizontal axis represents a pressure within the processing vessel, a vertical axis represents a microwave power, and values on the horizontal axis increases toward the right and values on the vertical axis increases downward. The pressure within the processing vessel is measured for every 20 mTorr, from, e.g., about 20 mTorr to about 140 mTorr, and the supplied microwave power is measured for every 500 W, from, e.g., about 1000 W to about 3000 W. Further, processing conditions for plasma generation are as follows: the pressure within the processing vessel is set to be in the range from, e.g., about 20 mTorr to about 140 mTorr; a mixture gas of He, HBr and $O_2$ is used as a processing gas; a processing time is, e.g., about 30 sec; and an applied bias power is, e.g., about 200 W. In FIG. 16, a region 86a indicates conditions under which generated plasma is stable; a region 86b indicates conditions under which generated plasma is slightly stable; and a region 86c indicates conditions under which generated plasma is unstable. Further, in the regions 86a to 86c, the same conditions are illustrated by the same hatching style. A table shown in FIG. 17 is created in the same manner as the table of FIG. 16. FIG. 16 depicts a case of performing a traveling wave power control, whereas FIG. 17 depicts a case of performing a load control. Further, in the case of FIG. 16, a control for applying a bias is also performed as the traveling wave control, and in the case of FIG. 17, a control for applying a bias is also performed as the load control.

Referring to FIG. 16 and FIG. 17, in performing the traveling wave power control, plasma is found to be unstable when the supplied microwave power ranges from about 1000 W to about 1500 W under the lowest pressure condition, i.e., when the pressure within the processing vessel is about 20 mTorr. Further, when the pressure within the processing vessel is about 40 mTorr and about 60 mTorr, plasma is found to be unstable when the supplied microwave power ranges from about 1000 W to about 3000 W. When the pressure within the processing vessel is about 80 mTorr, plasma is found to be unstable when the supplied microwave power ranges from about 1000 W to about 2500 W. When the pressure within the processing vessel is about 100 mTorr and about 120 mTorr, plasma is found to be unstable when the supplied microwave ranges from about 1000 W to about 1500 W. When the pressure within the processing vessel is about 140 mTorr, plasma is found to be instable when the supplied microwave power is about 1000 W. For these cases, processing conditions restricted to some extent are required to generate plasma stably.

In performing the load control, on the other hand, plasma is found to be unstable only when the supplied microwave power is about 1000 W under the condition that the pressure within the processing vessel is about 20 mTorr, about 40 mTorr and about 60 mTorr and further when the supplied microwave power is about 1500 W under the condition that the pressure within the processing vessel is about 60 mTorr. This result indicates that it is possible to generate relatively stable plasma under a wide range of processing conditions. In this load control, under the pressure within the processing vessel is about 40 mTorr, plasma generated when supplying the microwave power of about 2000 W and about 3000 W is slightly unstable.

Figure 18:
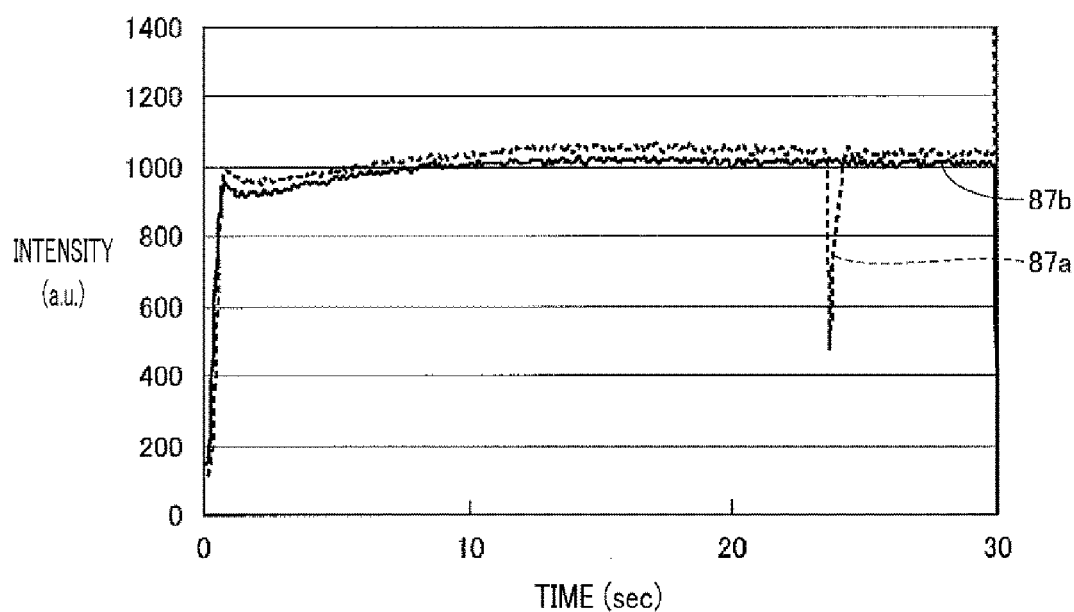
FIG. 18 is a graph showing a relationship between an elapsed time and a plasma emission intensity.

FIG. 18 is a graph showing a relationship between an elapsed time and a plasma emission intensity. In FIG. 18, a vertical axis represents an emission intensity (a.u.) at a wavelength of about 252 nm of silicon in OES, and a horizontal axis represents an elapsed time (sec). In this case, processing conditions for plasma generation are as follows: a pressure within the processing vessel is set to, e.g., about 120 mTorr; a mixture gas of He, HBr and $O_2$ is used as a processing gas; a processing times is, e.g., about 30 seconds; an applied bias power is, e.g., about 200 W; and a supplied microwave power is, e.g., about 1500 W. In FIG. 18, the traveling wave power control is indicated by a dotted line 87a, whereas the load control is indicated by a solid line 87b. Further, in the case indicated by the dashed line 87a, both a microwave power and a bias power are controlled through the traveling wave power control. In the case indicated by the solid line 87b, both a microwave power and a bias power are controlled through the load control. The same goes for the cases depicted in FIG. 19 and FIG. 20 to be described later.

Referring to FIG. 18, in performing the traveling wave power control, a peak at which the emission intensity decreases rapidly is observed at an elapsed time of, e.g., about 24 sec, as indicated by the dotted line 87a. That is, a spike may occur at this time. In contrast, in performing the load control, such a spike as observed in the case of the traveling wave power control does not occur. That is, the problem of spike is suppressed.

Figure 19:
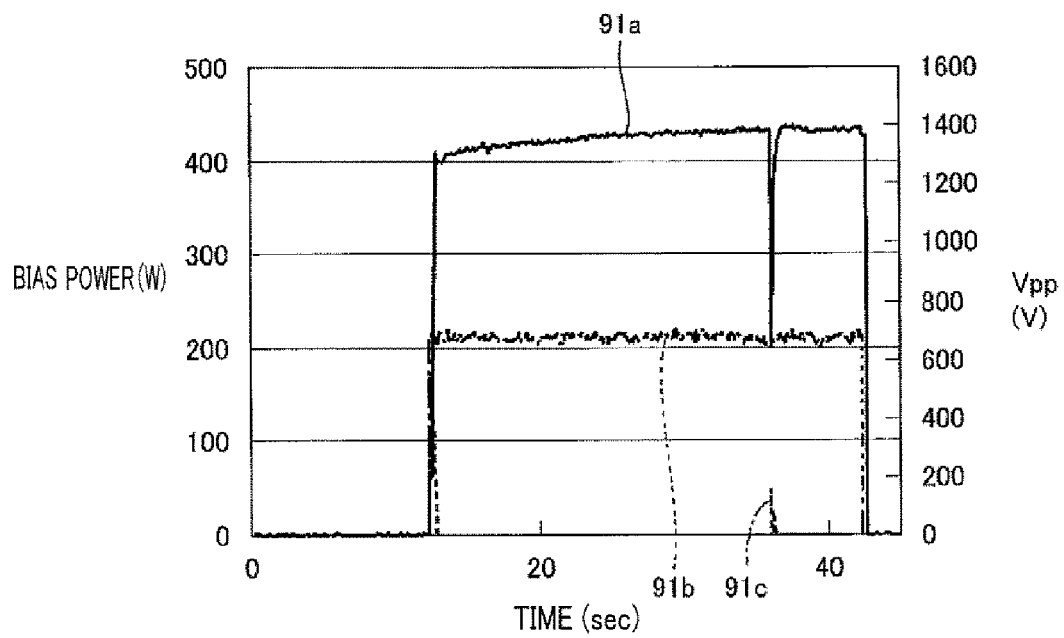
FIG. 19 is a graph showing a relationship between an elapsed time and a bias power.
Figure 20:
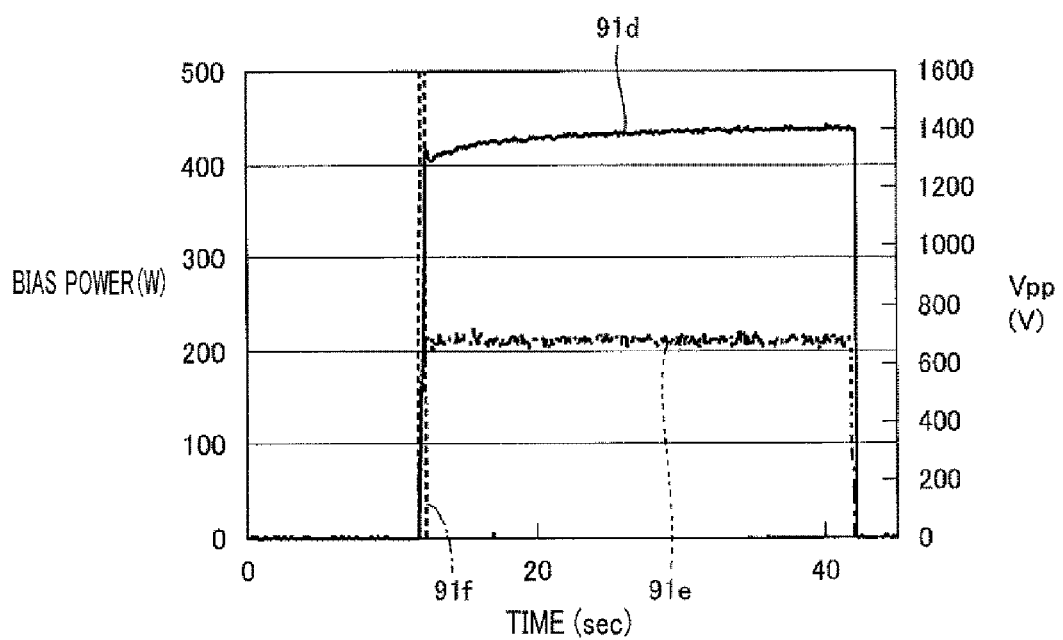
FIG. 20 is a graph showing a relationship between an elapsed time and a bias power.

In this case, comparison may be made by referring to bias voltages. FIG. 19 and FIG. 20 are graphs showing a relationship between an elapsed time and a bias power. In FIG. 19 and FIG. 20, a vertical axis represents a bias power (W) and a bias Vpp (peak to peak) (V), and a horizontal axis represents an elapsed time (sec). The vertical axis on the left side indicates a bias power (W), and the vertical axis on the right side indicates the Vpp (V). In FIG. 19 and FIG. 20, a Vpp is indicated by solid lines 91a and 91d; a traveling wave power is indicated by dotted lines 91b and 91e; and a reflected wave power is indicated by dashed dotted lines 91c and 91f, respectively.

Referring to FIG. 19, in performing the traveling wave power control, a peak at which the Vpp decreases greatly is observed at an elapsed time of, e.g., about 35 sec. That is, a spike may occur at this time during the application of the bias power. In contrast, referring to FIG. 20, in performing the load control, such a spike as observed in the traveling wave power control for the application of the bias power does not occur. That is, the problem of spike is suppressed. Referring to FIG. 16 and FIG. 17, this improvement is shown at a microwave power of about 1500 W under a pressure of about 120 mTorr in a region 86d of the matrix regarding the relation between the microwave power and the pressure within the processing vessel.

Figure 21:
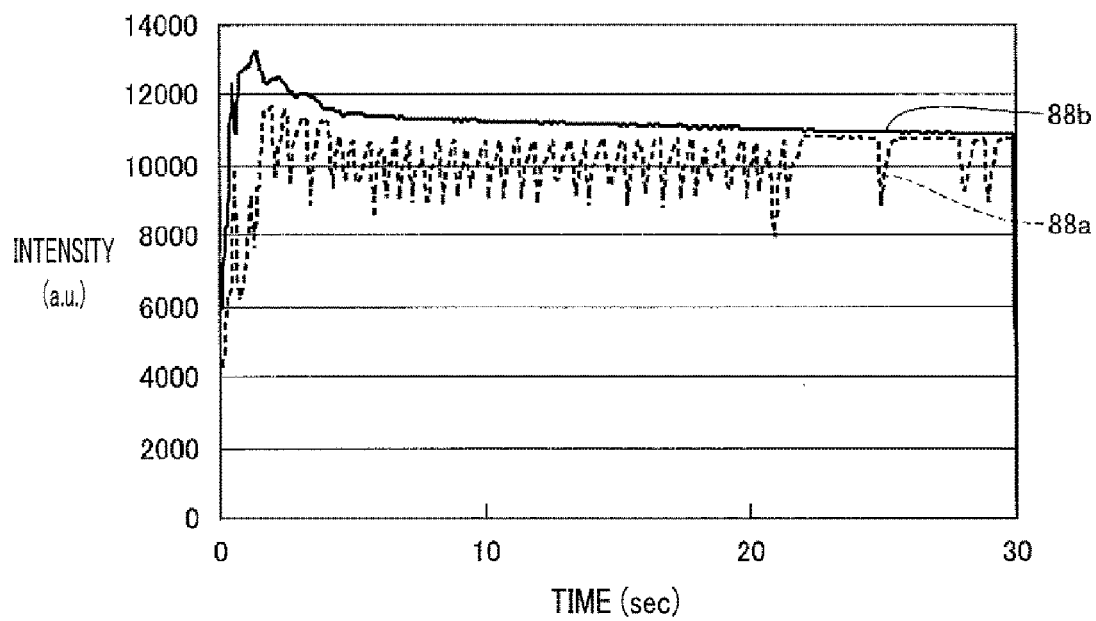
FIG. 21 is a graph showing a relationship between an elapsed time and a plasma emission intensity.

Further, other processing conditions are as follows. FIG. 21 is a graph showing a relationship between an elapsed time and a plasma emission intensity. In FIG. 21, a vertical axis represents an emission intensity (a.u.) at a wavelength of, e.g., about 252 nm of silicon in OES, and a horizontal axis represents an elapsed time (sec). That is, the vertical axis or the like of the graph is the same as in the case of FIG. 18. Further, processing conditions for plasma generation are as follows: a pressure within the processing vessel is set to, e.g., about 40 mTorr; a mixture gas of He, HBr and $O_2$ is used as a processing gas; a processing times is, e.g., about 30 seconds; an applied bias power is, e.g., about 200 W; and a supplied microwave power is, e.g., about 1500 W. In FIG. 21, the traveling wave power control is indicated by a dotted line 88a, whereas the load control is indicated by a solid line 88b. Further, in the case indicated by the dotted line 88a, both a microwave power and a bias power are controlled through the traveling wave power control. In the case indicated by the solid line 88b, both a microwave power and a bias power are controlled through the load control. The same goes for the cases depicted in FIG. 22 and FIG. 23 to be described later.

Referring to FIG. 21, in performing the traveling wave power control, the emission intensity is found to be fluctuated greatly at an elapsed time ranging from about 2 sec to about 22 sec, as indicated by the dotted line 88a. That is, the hunting may occur at this time. In contrast, in performing the load control, such a hunting as observed in the case of the traveling wave power control does not occur. That is, the problem of hunting is suppressed.

Figure 22:
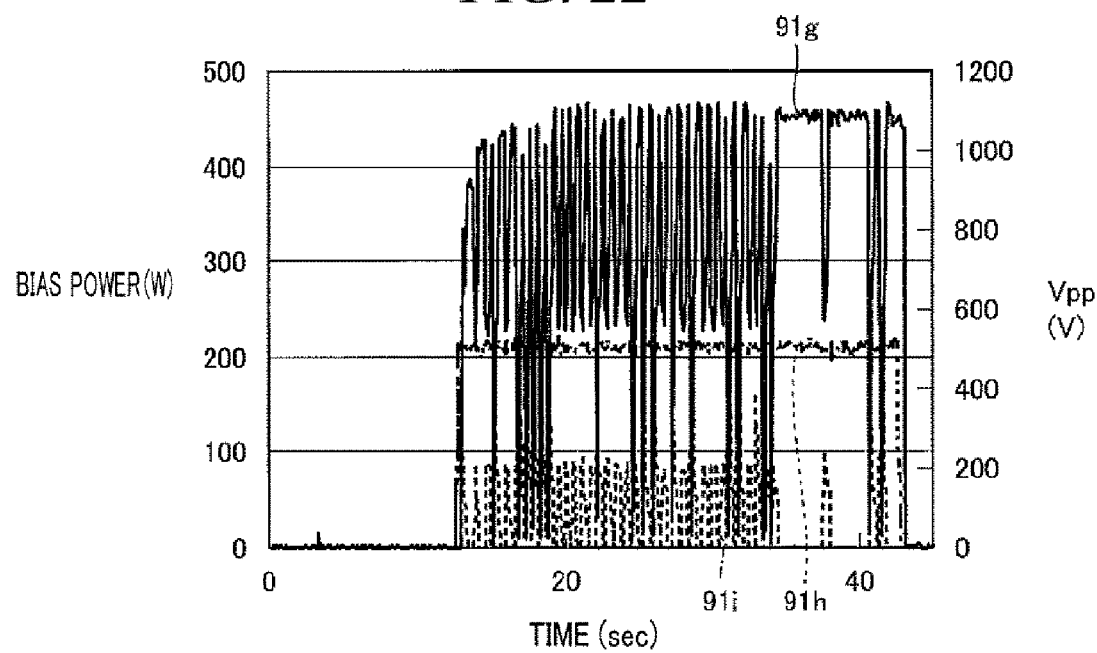
FIG. 22 is a graph showing a relationship between an elapsed time and a bias power.
Figure 23:
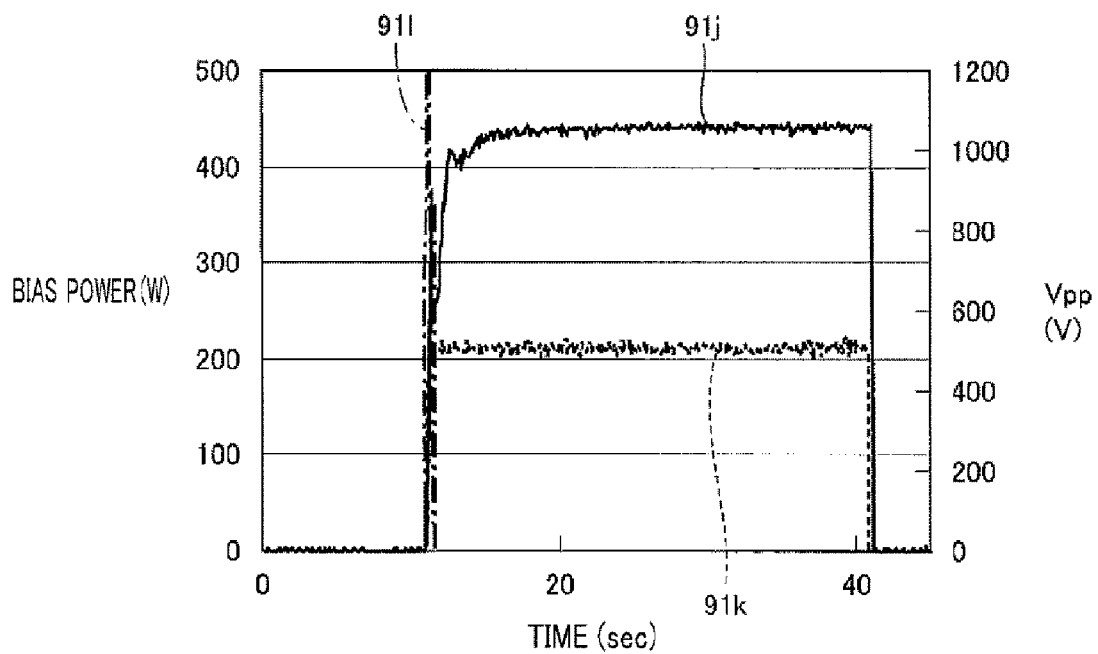
FIG. 23 is a graph showing a relationship between an elapsed time and a bias power.

In this case as well, comparison may be made by referring to bias voltages. FIG. 22 and FIG. 23 are graphs showing a relationship between an elapsed time and a bias power. In FIG. 22 and FIG. 23, a vertical axis represents a bias power (W) and a bias Vpp (peak to peak) (V), and a horizontal axis represents an elapsed time (sec). The vertical axis on the left side indicates a bias power (W), and the vertical axis on the right side indicates the Vpp (V). In FIG. 22 and FIG. 23, a Vpp is indicated by solid lines 91g and 91j; a traveling wave power is indicated by dotted lines 91h and 91k; and a reflected wave power is illustrated by dashed dotted lines 91i and 91l, respectively.

Referring to FIG. 22, in performing the traveling wave power control, the Vpp is found to be fluctuated greatly at an elapsed time of about 12 sec. That is, the hunting may occur at this time during the application of the bias power. In contrast, referring to FIG. 23, in case of the load control, such a hunting as observed in the case of the traveling wave power control does not occur. That is, the problem of hunting is suppressed. Referring to FIG. 16 and FIG. 17, this improvement is shown at a microwave power of about 1500 W under a pressure of about 40 mTorr in a region 86e of the matrix regarding the relation between the microwave power and the pressure within the processing vessel.

In the above-described example embodiment, a control operation start time by the load control device is set to, e.g., about 60 μs. However, it may also be possible to set the control operation start time by the load control device to be equal to or less than, e.g., about 50 μs.

Figure 24:
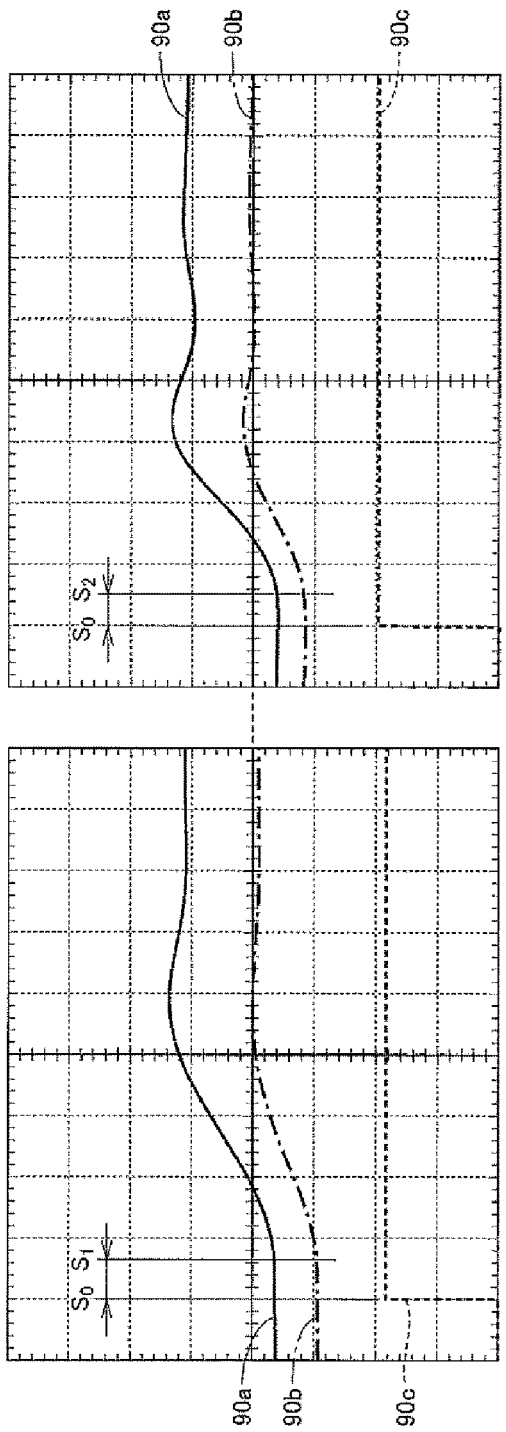
FIG. 24 is a graph showing a difference in control operation start time by a load control device.

FIG. 24 is a graph showing a difference in the control operation start time by the load control device. In FIG. 24, the left graph indicates a case where the control operation start time by the load control device is set to, e.g., about 60 μs, and the right graph indicates a case where the control operation start time by the load control device is set to, e.g., about 50 μs. The control operation start time is a time taken, after a reflected wave power is detected, to make a request to supply an anode voltage corresponding to the sum of a traveling wave power and the reflected wave power to the magnetron, and vary the anode voltage in response to the request and detect the varied anode voltage as a traveling wave power. In FIG. 24, a vertical axis represents a voltage (V), and a horizontal axis represents an elapsed time (sec). In FIG. 24, a solid line 90a indicates a traveling wave power (Pf) which is being monitored; a dashed dotted line 90b, an anode voltage; and a dotted line 90c, a reflected wave power Pr which is monitored as a trigger.

Referring to FIG. 24, a period from a time $S_0$ to a time $S_1$ on the left graph is set to be, e.g., about 60 μs, whereas a period from a time $S_0$ to a time $S_2$ on the right graph is set to be, e.g., about 50 μs. That is, the control operation start time on the right graph is about 10 μs shorter than that on the left graph. With this configuration, it is possible to perform a stable plasma process more securely under a wider range of processing conditions. Further, in order to suppress a mode jump in various modes, it is desirable that the control operation start time is as short as possible. By way of non-limiting example, it may be desirable that the control operation start time is less than, e.g., about 1 μs.

Figure 25:
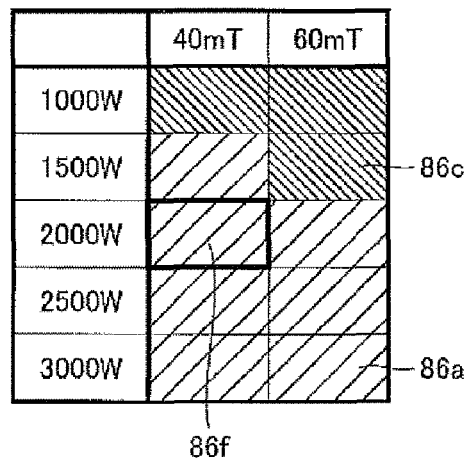
FIG. 25 is a table showing a stability degree of generated plasma depending on a pressure within a processing vessel and a supplied microwave power.

FIG. 25 is a table showing a stability degree of generated plasma depending on a pressure within the processing vessel and a supplied microwave power. FIG. 25 corresponds to FIG. 16 and FIG. 17, and a part of the processing conditions of the pressure within the processing vessel and the supplied microwave power are extracted therefrom.

Referring to FIG. 16, FIG. 17 and FIG. 25, as compared to the case where the control operation start time by the load control device is set to, e.g., about 60 μs, processing conditions under which the generated plasma is stable is widened when the control operation start time by the load control device is set to, e.g., about 50 μs. To elaborate, if the control operation start time by the load control device is, e.g., about 60 μs when the pressure within the processing vessel is, e.g., about 40 mTorr and the supplied microwave power is, e.g., about 2000 W and about 3000 W, the generated plasma may be slightly unstable. If the control operation start time by the load control device is, e.g., about 50 μs, it is possible to generate stable plasma under the same processing conditions.

Figure 26:
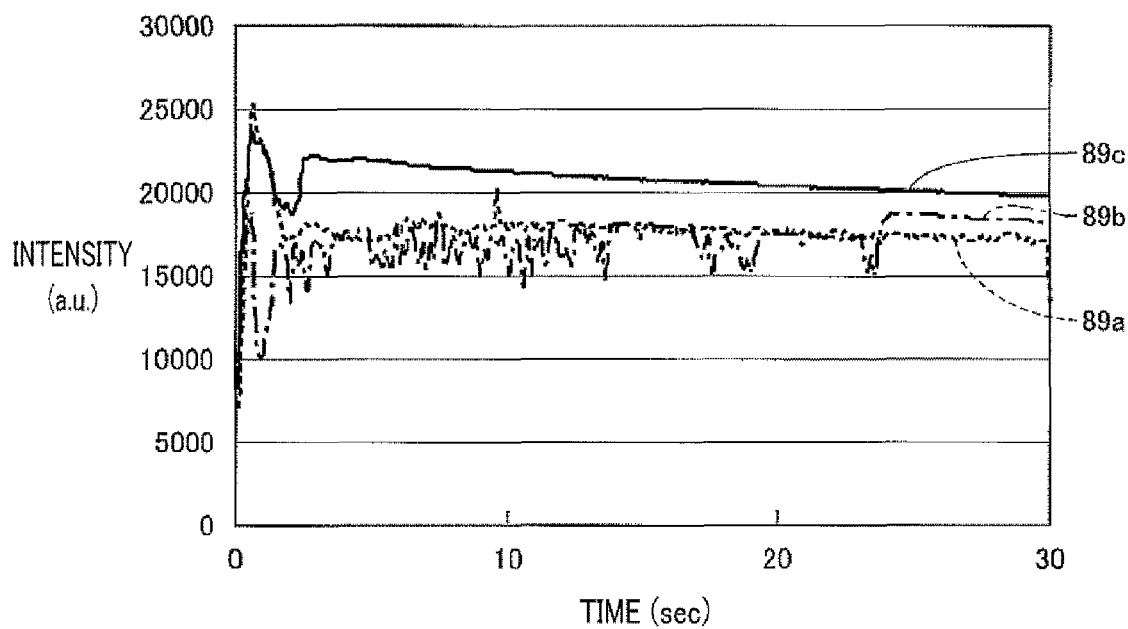
FIG. 26 is a graph showing a relationship between an elapsed time and a plasma emission intensity.

FIG. 26 is a graph showing a relationship between an elapsed time and a plasma emission intensity. In FIG. 26, a vertical axis represents an emission intensity (a.u.) at a wavelength of, e.g., about 252 nm of silicon in OES, and a horizontal axis represents an elapsed time (sec). The way to analyze the graph is the same as in the cases of FIG. 18 and FIG. 21. In this case, processing conditions for plasma generation are as follows: a pressure within the processing vessel is, e.g., about 40 mTorr; a mixture gas of He, HBr and $O_2$ is used as a processing gas; a processing time is, e.g., about 30 seconds; an applied bias power is, e.g., about 200 W; and a supplied microwave power is, e.g., about 2000 W. In FIG. 26, the traveling wave power control is indicated by a dotted line 89a, and the load control in which the control operation start time is set to, e.g., about 60 μs is indicated by a dashed dotted line 89b and the load control in which the control operation start time is set to, e.g., about 50 μs is indicated by a solid line 89c. Further, in the case indicated by the dotted line 89a, both a microwave power and a bias power are controlled through the traveling wave power control. In the cases indicated by the dashed dotted line 89b and the solid line 89c, both a microwave power and a bias power are controlled through the load control.

Referring to FIG. 26, in performing the traveling wave power control indicated by the dotted line 89a, the emission intensity is found to be fluctuated greatly at an elapsed time range from about 2 sec to about 20 sec. That is, the hunting may occur at this time. In contrast, in performing the load control, which is indicated by the dashed dotted line 89b, in which the control operation start time is set to, e.g., about 60 µs, a generation amount of such a hunting as observed in the case of the traveling wave power control is found to be greatly reduced. Further, in performing the load control, which is indicated by the solid line 89c, in which the control operation start time is set to, e.g., about 50 µs, the hunting does not occur. That is, the problem of hunting is greatly suppressed. Referring to FIG. 17 and FIG. 25, this improved is shown at a microwave power of about 2000 W under a pressure of about 40 mTorr of a region 86f regarding the relation between the microwave power and the pressure within the processing vessel.

As can be seen from the foregoing, it is possible to perform a stable plasma process more securely by using the plasma processing apparatus, the plasma processing method and the high frequency generator as described above.

In the above-described example embodiment, the voltage control circuit as the voltage control device includes a switching device configured to switch a circuit constituting the load control device. This switching device is adopted in a case where the traveling wave power control is performed when a reflected wave power is not stable immediately after supplying a microwave power, and then, the load control is performed. However, the example embodiment may not be limited thereto. By way of example, in the event that the load control is performed all the time, such a switching device may not be provided.

Further, in the above-described example embodiment, the microwave generator of the plasma processing apparatus includes the 4E tuner as the matching device. If, however, there may occur no error in a measurement system for the load control or the like even when a great reflected wave power is generated, the matching device such as the 4E tuner need not be provided.

Moreover, in the above-described example embodiment, the high voltage power supply included in the microwave generator is used as a supply source for an anode voltage and a filament voltage. However, the example embodiment may not be limited thereto, and supply sources for the anode voltage and the filament voltage may be provided respectively.

In addition, in the above-described example embodiment, the subtracting circuit is provided. However, the example embodiment may not be limited thereto, and it may be possible to calculate a power to be added to a traveling wave power based on a reflected wave power by using a circuit other than the subtracting circuit.

Furthermore, in the above-described example embodiment, the load control device is described to perform the load control, i.e., to control the power supply to supply an anode voltage corresponding to the sum of the traveling wave power measured by the traveling waver power measuring device and the reflective wave power measured by the reflected wave power measuring device, the example embodiment may not be limited thereto. It may be possible to supply to the magnetron an anode voltage corresponding to a power calculated by adding a power calculated based on the reflected wave power measured by the reflected wave power measuring device to the traveling wave power measured by the traveling wave power measuring device. By way of example, it may be possible to supply an anode voltage corresponding to a power calculated by additionally adding a certain percentage of the measured reflected wave power to the sum of the traveling wave power and the reflected wave power. Further, it may be also possible to supply an anode voltage corresponding to a power calculated by adding a certain percentage of the measured reflected wave power to the traveling wave power. For these cases, one of the aforementioned controls may be selected when, for example, starting a supply of a microwave power or when performing a plasma process on a processing target substrate in the state where the mode is stable. Further, in these cases, a power supplied by the high voltage power supply may be controlled to fall within an allowable power range allowed by the magnetron. Moreover, even when a power exceeding the allowable power range is supplied by the voltage control device, the power may be supplied while setting an upper limit of the allowable power range of the magnetron to be a maximum level under the control of the microwave generator or under the control of the controller of the plasma processing apparatus. That is, a so-called limiter for the supply power may be provided. Furthermore, the reflected wave power is not greater than the traveling wave power. Thus, when the traveling wave power and the reflected power are added, the sum does not exceed twice the traveling wave power Further, in the above-described example embodiment, the magnetron is used as the high frequency oscillator. However, the example embodiment may not be limited thereto, and another type of high frequency oscillator, such as a high frequency oscillator, which has a solid state power supply and in which a mode jump takes place, may be used. In such a case, the aforementioned anode voltage may be supplied as a simple voltage.

Further, in the above-described example embodiment, a plasma process is performed with a microwave by using a radial line slot antenna. However, the example embodiment may not be limited thereto. By way of non-limiting example, a plasma processing apparatus which has a comb teeth-shaped antenna unit and is configured to generate plasma by a microwave or a plasma processing apparatus which is configured to generate plasma by radiating a microwave through slots may be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing apparatus that performs a process on a processing target object by using plasma, the apparatus comprising:
    a processing vessel configured to perform therein the process by the plasma; and
    a plasma generating device, having a high frequency generator which is provided outside the processing vessel and is configured to generate a high frequency wave, configured to generate the plasma within the processing vessel by using the high frequency wave generated by the high frequency generator,
    wherein the high frequency generator comprises:
    a high frequency oscillator configured to generate a high frequency wave;
    a waveguide configured to propagate the high frequency wave generated by the high frequency oscillator to the processing vessel serving as a load side;
    a power supply configured to supply a voltage to the high frequency oscillator;

a traveling wave power measuring device configured to measure a power of a traveling wave that propagates to the load side;

a reflected wave power measuring device configured to measure a power of a reflected wave reflected from the load side;

a voltage control device configured to control the voltage supplied to the high frequency oscillator by the power supply; and a directional coupler configured to output the traveling wave and the reflected wave propagating in the waveguide to the voltage control device, wherein the voltage control device comprises:

a load control device configured to supply, to the high frequency oscillator, a voltage corresponding to a power calculated by adding a power calculated based on the power of the reflected wave measured by the reflected wave power measuring device to the power of the traveling wave measured by the traveling wave power measuring device.

2. The plasma processing apparatus of claim 1,
wherein the voltage control device further comprises a subtracting circuit configured to calculate a difference between the power of the traveling wave measured by the traveling wave power measuring device and the power of the reflected wave measured by the reflected wave power measuring device.

3. The plasma processing apparatus of claim 1, further comprising:

a holding table configured to hold the processing target object thereon; and a bias power application device configured to apply a bias power to the processing target object held on the holding table, wherein the bias power application device is configured to perform a load control of the applied bias power.

4. The plasma processing apparatus of claim 1,
wherein the voltage control device is configured to set a control operation start time by the load control device is equal to or less than about 50 μs.

5. The plasma processing apparatus of claim 1,
wherein the voltage control device is configured to control a filament voltage supplied to the high frequency oscillator by the power supply depending on the supplied voltage.

6. The plasma processing apparatus of claim 1,
wherein the voltage control device is configured to control the voltage supplied by the power supply such that the voltage falls within a preset power range allowed by the high frequency oscillator.

7. The plasma processing apparatus of claim 1,
wherein the voltage control device further comprises a switching device configured to switch a circuit forming the load control device.

8. The plasma processing apparatus of claim 1,
wherein the voltage control device further comprises a switching circuit configured to output a power signal to the high frequency oscillator from the power supply, and
the switching circuit comprises an insulated gate bipolar transistor or a field effect transistor.

9. The plasma processing apparatus of claim 1,
wherein the plasma generating device comprises:
a dielectric window configured to transmit the high frequency wave generated by the high frequency oscillator into the processing vessel; and a slot antenna plate, having a plurality of slots, configured to radiate the high frequency wave to the dielectric window.

10. A plasma processing method of performing a process on a processing target substrate by using plasma processing apparatus including a processing vessel configured to perform therein the process by the plasma; and a plasma generating device, having a high frequency generator which is provided outside the processing vessel and is configured to generate a high frequency wave, configured to generate the plasma within the processing vessel by using the high frequency wave generated by the high frequency generator, the high frequency generator including a high frequency oscillator configured to generate a high frequency wave; a waveguide configured to propagate the high frequency wave generated by the high frequency oscillator to the processing vessel serving as a load side; a power supply configured to supply a voltage to the high frequency oscillator; a voltage control device configured to control the voltage supplied to the high frequency oscillator by the power supply; and a directional coupler configured to output the traveling wave and the reflected wave propagating in the waveguide to the voltage control device, the method comprising:

measuring a power of a traveling wave which propagates to the load side;

measuring a power of a reflected wave reflected from the load side; and performing a load control of supplying, to the high frequency oscillator, a voltage corresponding to a power calculated by adding a power calculated based on the measured power of the reflected wave to the measured power of the traveling wave.

11. The plasma processing method of claim 10,
wherein, in the performing of the load control, the power supply is controlled to supply a voltage corresponding to the sum of the power of the traveling wave and the power of the reflected wave.

12. A high frequency generator configured to generate a high frequency power, comprising:

a high frequency oscillator configured to generate a high frequency wave;

a traveling wave power measuring device configured to measure a power of a traveling wave that propagates to a load side;

a reflected wave power measuring device configured to measure a power of a reflected wave reflected from the load side;

a power supply configured to supply a voltage to the high frequency oscillator;

a voltage control device configured to control the voltage supplied to the high frequency oscillator; and a directional coupler configured to output the traveling wave and the reflected wave propagating in the waveguide to the voltage control device, wherein the voltage control device comprises a load control device configured to supply, to the high frequency oscillator, a voltage corresponding to a power calculated by adding a power calculated based on the power of the reflected wave measured by the reflected wave power measuring device to the power of the traveling wave measured by the traveling wave power measuring device.

* * * * *